United States Patent [19]

Matsumoto et al.

[11] Patent Number: 5,682,239
[45] Date of Patent: Oct. 28, 1997

[54] APPARATUS FOR DETECTING POSITIONAL DEVIATION OF DIFFRACTION GRATINGS ON A SUBSTRATE BY UTILIZING OPTICAL HETERODYNE INTERFERENCE OF LIGHT BEAMS INCIDENT ON THE GRATINGS FROM FIRST AND SECOND LIGHT EMITTERS

[75] Inventors: Takahiro Matsumoto, Utsunomiya; Kenji Saitoh, Atsugi; Koichi Sentoku, Utsunomiya, all of Japan

[73] Assignee: Canon Kabushiki Kaisha, Tokyo, Japan

[21] Appl. No.: 528,817

[22] Filed: Sep. 15, 1995

[30] Foreign Application Priority Data

Sep. 19, 1994 [JP] Japan .................................. 6-251344

[51] Int. Cl.⁶ .......................................................... G01B 9/02
[52] U.S. Cl. .............................. 356/349; 356/363; 250/548
[58] Field of Search ............................... 356/345, 351, 356/349, 356, 363; 250/548

[56] References Cited

U.S. PATENT DOCUMENTS

| | | | |
|---|---|---|---|
| 4,895,447 | 1/1990 | Jarisch et al. | 356/356 |
| 5,114,236 | 5/1992 | Matsugu et al. | 356/401 |
| 5,196,711 | 3/1993 | Matsugu et al. | 250/548 |
| 5,200,800 | 4/1993 | Suda et al. | 356/401 |
| 5,285,259 | 2/1994 | Saitoh | 356/401 |
| 5,313,272 | 5/1994 | Nose et al. | 356/375 |
| 5,333,050 | 7/1994 | Nose et al. | 356/356 |
| 5,369,486 | 11/1994 | Matsumoto et al. | 356/349 |
| 5,377,009 | 12/1994 | Kitaoka et al. | 356/401 |
| 5,396,335 | 3/1995 | Hasegawa et al. | 356/401 |
| 5,432,603 | 7/1995 | Sentoku et al. | 356/349 |
| 5,455,679 | 10/1995 | Houryu et al. | 356/401 |
| 5,465,148 | 11/1995 | Matsumoto et al. | 356/349 |

FOREIGN PATENT DOCUMENTS 4-212002  8/1992  Japan .

*Primary Examiner*—Frank G. Font
*Assistant Examiner*—Robert Kim
*Attorney, Agent, or Firm*—Fitzpatrick, Cella, Harper & Scinto

[57] ABSTRACT

Apparatus for detecting a positional deviation of two diffraction gratings of each of first and second pairs of diffraction gratings formed on a substrate, by utilizing an optical heterodyne interference method. The apparatus includes a first light emitter for emitting a pair of coherent light beams having different frequencies close to a first frequency, a second light emitter for emitting a pair of coherent light beams having different frequencies close to a second frequency, different from the first frequency, a four-way radiating unit radiating the two pairs of light beams in four directions and for causing a selected pair of the light beams to be incident on a corresponding one of the first and second pairs of the diffraction gratings such that corresponding beam spots overlap with each other, a splitter for splitting diffracted light beams from the diffraction gratings according to frequencies of the diffracted light beams, to separate a first diffracted light beam, which is diffracted from the first pair of diffraction gratings in a diffraction direction, and a second diffracted light beam, which is diffracted from the second pair of diffraction gratings in the same diffraction direction, a beat signal detector for detecting beat signals respectively corresponding to the split light beams, and a deviation detecting unit for receiving the detected beat signals and for detecting a positional deviation in a predetermined direction of two diffraction gratings of each of the first and second pairs, from the beat signals respectively corresponding to the two diffraction gratings of a corresponding one of the first and second pairs.

7 Claims, 21 Drawing Sheets

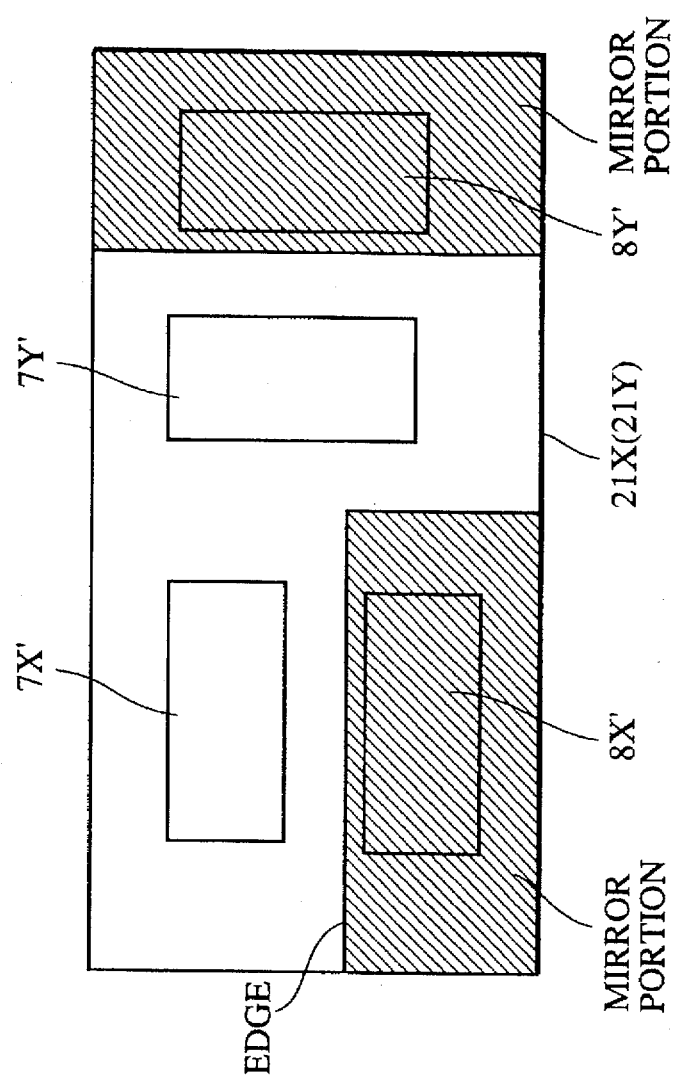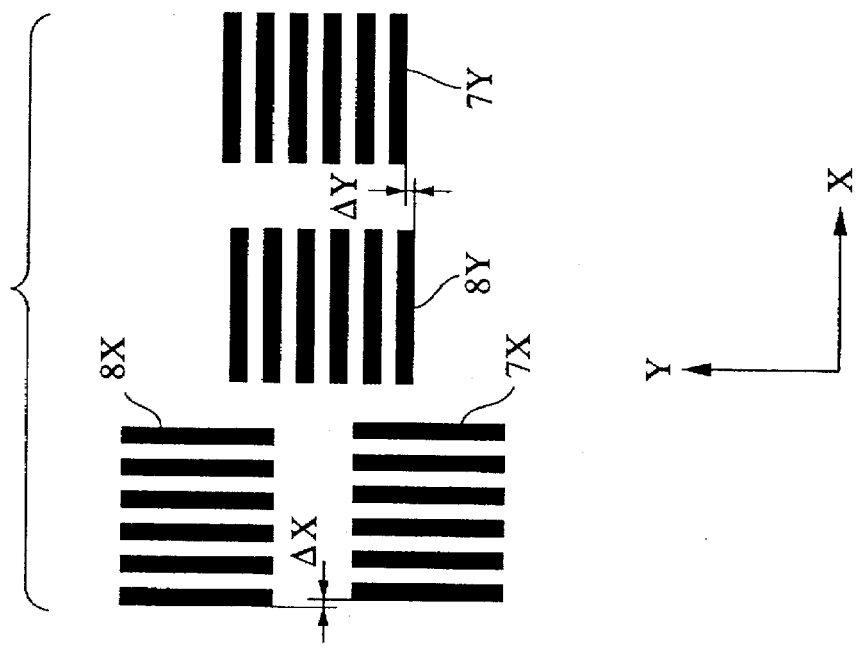

APPARATUS FOR DETECTING POSITIONAL DEVIATION OF DIFFRACTION GRATINGS ON A SUBSTRATE BY UTILIZING OPTICAL HETERODYNE INTERFERENCE OF LIGHT BEAMS INCIDENT ON THE GRATINGS FROM FIRST AND SECOND LIGHT EMITTERS

BACKGROUND OF THE INVENTION

1. Field of the Invention

The present invention relates to an apparatus for detecting a positional deviation by utilizing optical heterodyne interference. Further, the present invention can be preferably applied to measuring devices which detect positional deviations, namely, differences in position among a plurality of diffraction gratings with high accuracy by utilizing what is called an optical heterodyne interference method, for example, a device for measuring printing registration accuracy.

2. Description of the Related Art

Hitherto, what is called an optical heterodyne interference method of performing phase detection or demodulation of information representing the phase of light, which bears a linear relation to a displacement, has been widely used for measuring minute displacement with high accuracy. In the case of employing the optical heterodyne interference method, time-varying interference fringes produced by interference between light rays or beams of luminous fluxes, respectively having slightly different frequencies, are photoelectrically detected and subsequently, the phases of the interference fringes are converted into the phase of an electrical signal so as to measure the displacement.

For instance, in the Japanese Patent Public Disclosure No. 4-212002/1992 Official Gazette, the Applicant of the instant application has proposed a system shown in FIG. 22 for detecting a positional deviation between two diffraction gratings by using the optical heterodyne interference method, with the intention of measuring the alignment accuracy of semiconductor equipment.

As shown in FIG. 22, light having passed through a beam expander 443 and a half mirror 444 consists of S-polarized light having a frequency of $f_1$ and P-polarized light having a frequency of $f_2$. Light transmitted by the half mirror 444 is led to a lens 447 by a polarization beam splitter 446 and a mirror 451 and is then incident upon a diffraction grating pattern 449 placed on a wafer 448. Here, $f_1(S)$ and $f_2(P)$ designate the S-polarized light having the frequency of $f_1$ and the P-polarized light having the frequency of $f_2$, respectively. When the light is made to be incident thereon on a condition that the following equation is satisfied:

$$P\sin\theta=\lambda$$

where P and $\lambda$ denote the pitch of the diffraction grating 449 and the wavelength of the light, respectively, light diffracted by the diffraction grating pattern 449 advances in a direction normal to the wafer 448. Here, $f_1'(S)$ and $f_2'(P)$ designate a diffracted light beam generated by the diffraction of the light $f_1(S)$ and a diffracted light beam generated by the diffraction of the light $f_2(P)$, respectively. After passing through the polarization beam splitter 450, the diffracted light beams $f_1'(S)$ and $f_2'(P)$ reach sensors 454 and 457, respectively. On the other hand, the light beams $f_1(S)$ and $f_2(P)$ reflected by the half mirror 444 are further reflected by a mirror 445 and are then made to pass through the polarization beam splitter 450. Subsequently, the light beams $f_1(S)$ and $f_2(P)$ reach the sensors 454 and 457, respectively. Thus, the light beams having reached the sensor 454 are $f_1'(S)$ and $f_2(P)$ respectively having planes of polarization, which are orthogonal to each other if these light beams are directly incident upon this sensor. Therefore, a polarizing plate 452 is placed immediately in front of this sensor in such a manner as to be oriented at an angle of 45 degrees with each of the polarization directions of these light rays.

Meanwhile, when light beams are projected through the lens 447 in such a manner that the entire diffraction patterns or gratings 449 (namely, 211-1 and 211-2 of FIG. 23) formed on the wafer 448 are irradiated with the light beams, the light beams are diffracted by both of the diffraction gratings 211-1 and 211-2 of FIG. 23. Here, an aperture for cutting off unnecessary diffracted light beams is placed in such a manner as to bear a conjugate relation to the gratings or patterns 449 with respect to the lenses 447, 453 and 456, with the intention of allowing only the light beam diffracted by the diffraction grating 211-1 to be incident upon the sensor or photodetector 454, of allowing only the light beam diffracted by the diffraction grating 211-2 to reach the sensor 457 but of inhibiting the light beam diffracted by the other diffraction grating from being incident to each of these sensors. Reference numeral 460 designates this aperture. Incidentally, similarly, another aperture 461 is placed immediately in front of the sensor 457.

Meanwhile, the light beams having reached the sensor 457 are $f_2'(P)$ and $f_1(S)$. In this case, a polarizing plate 455 is placed just in front of the sensor 457.

Thereby, beat signals obtained from the diffracted light beams are detected by the sensors 454 and 457, respectively. Further, the positional deviation between the two diffraction gratings is detected with high accuracy by making a comparison between the phases of the two beat signals respectively detected by these sensors 454 and 457. In the case when there is a difference $\Delta X$ in position in the X-direction between the diffraction gratings 211-1 and 211-2, if it is assumed that ±first-order diffracted light is used, the difference $\Delta\phi$ in phase between the beat signals respectively detected by the sensors 454 and 457 is obtained by $$\Delta\phi=4\pi\cdot\Delta X/P \tag{1}$$

where P denotes the pitch of the diffraction gratings. Thus, the difference $\Delta\phi$ in phase between the beat signals is detected and subsequently, the difference $\Delta X$ in position in the X-direction between the diffraction gratings is calculated from the equation (1).

It is, however, necessary for a positional deviation detecting apparatus to detect a positional deviation in a direction perpendicular to the X-direction (namely, a positional deviation in the Y-direction) in addition to the positional deviation in the X-direction. The following methods have been devised as methods for detecting a positional deviation in the Y-direction. Namely, (i) Linear diffraction gratings for measuring the positional deviation in the Y-direction are provided in the apparatus separately from the linear diffraction gratings for measuring the positional deviation in the X-direction. Alternatively, checkered diffraction gratings are provided therein. Further, the positional deviation in the Y-direction is measured by turning the optical system with respect to the diffraction gratings serving as a measuring mark.

(ii) Alternatively, two optical systems respectively used to detect the positional deviations in both of the X- and Y-directions are preliminarily provided in the apparatus.

However, in the former case, namely, in the case of the method (i), it is sufficient for the apparatus to have only one optical system. In such a case, the positional deviations respectively corresponding to the two directions, namely, the X- and Y-directions cannot be measured at the same time. Thus, a low throughput is a drawback of this method. In contrast, in the latter case, namely, in the case of the method (ii), when providing two sets of optical systems in the apparatus, an additional optical system obtained by turning, for example, the optical system of FIG. 22 by 90 degrees is prepared and combined with the other optical system. Thus, there have been caused problems of spatial interference due to an optical component (for instance, the polarization beam splitter 450) and of crosstalk between beams respectively used for detecting the positional deviation in the X-direction and the positional deviation in the Y-direction. Consequently, there has occurred the necessity of spacing the two sets of optical systems apart from each other. As a result, a position, at which the positional deviation in the X-direction is measured, becomes different from another position, at which the positional deviation in the Y-direction is measured. This method results in improving the throughput in comparison with the former method (i). Even in the latter case, however, the positional deviation in the X-direction and the positional deviation in the Y-direction cannot be simultaneously measured at the same point on the semiconductor wafer.

SUMMARY OF THE INVENTION

Accordingly, an object of the present invention is to provide an apparatus for detecting a positional deviation by utilizing optical heterodyne interference, which has a relatively simple configuration and can simultaneously measure a positional deviation in the X-direction and a positional deviation in the Y-direction with high precision and throughput by irradiating diffraction gratings with light beams having two different frequencies from directions respectively opposite to the X- and Y-directions, then splitting diffracted light beams, which are upwardly emitted from the gratings, into a beam for measuring a positional deviation in the X-direction and another beam for measuring a positional deviation in the Y-direction, and detecting a difference in phase between two beat signals respectively corresponding to the beams.

To achieve the foregoing object, in accordance with an aspect of the present invention, there is provided a positional deviation detecting apparatus utilizing optical heterodyne interference, for detecting a positional deviation in a predetermined direction of two diffraction gratings of each of first and second pairs of diffraction gratings formed on a surface of a substrate, which comprises light source means for emitting a pair of coherent light beams having different frequencies four-way radiating means for receiving the pair of coherent light beams from the light source means, for forming two pairs of the light beams from the received pair of light beams for radiating the two pairs of light beams in four directions and for causing a selected pair of the light beams to be incident on a corresponding one of the first and second pairs of the diffraction gratings such that corresponding beam spots on the corresponding one of the first and second pairs of the diffraction gratings overlap with each other, beat signal detecting means for splitting a first diffracted light beam of a predetermined order, which is diffracted from the first pair of diffraction gratings in a diffraction direction perpendicular to the surface of the substrate, and a second diffracted light beam of a predetermined order, which is diffracted from the second pair of diffraction gratings in the same diffraction direction as that of the first diffraction beam, into light beams respectively diffracted from a corresponding one of the diffraction gratings of the first and second pairs, and for detecting beat signals respectively corresponding to the split light beams, and deviation detecting means for receiving the beat signals detected by the beat signal detecting means and for detecting a positional deviation in a predetermined measuring direction of two diffraction gratings of each of the first and second pairs, from the beat signals respectively corresponding to the two diffraction gratings of a corresponding one of the first and second pairs.

Further, in the case of a preferred embodiment of this positional deviation detecting apparatus, the four-way radiating means includes means for radiating the two pairs of coherent light beams in four directions in a plane parallel to the surface of the substrate.

Moreover, in the case of another preferred embodiment of the positional deviation detection apparatus, the first diffracted light beam and the second diffracted light beam are polarized light rays respectively having planes of polarization which are normal to each other. Further, the beat signal detecting means includes a polarization beam splitter for separating the first diffracted light beam from the second diffracted light beam.

Furthermore, in the case of still another preferred embodiment of the positional deviation detection apparatus, the light source means comprises a Zeeman laser.

Additionally, in the case of yet another preferred embodiment of the positional deviation detection apparatus, the light source means includes a single-frequency laser and an acousto-optical modulator for forming the two pairs of coherent light beams.

Besides, in the case of a further preferred embodiment of the positional deviation detecting apparatus, the four-way radiating means comprises at least a beam splitter, a polarization beam splitter and a wave plate.

In addition, in the case of an additional preferred embodiment of the positional deviation detecting apparatus, the beat signal detecting means comprises one of a dichroic mirror and a diffraction grating for splitting the light beams respectively diffracted from the diffraction gratings of the first and second pairs.

In accordance with another aspect of the present invention, there is provided a positional deviation detecting apparatus for detecting a positional deviation in a first direction, which is in a plane of a substrate, of two diffraction gratings of a first pair of diffraction gratings formed on the surface of the substrate and for detecting a positional deviation in a second direction perpendicular to the first direction, which is in the plane of the substrate, of two diffraction gratings of a second pair of diffraction gratings formed on the surface of the substrate by utilizing optical heterodyne interference. This positional deviation detecting apparatus comprises light source means for emitting a pair of coherent light beams of different frequencies, four-way radiating means for dividing the pair of coherent light beams received from the light source means into a first pair of coherent light beams and a second pair of coherent light beams and for radiating the light beams in four directions, irradiating means for causing two light beams respectively corresponding to the first pair of light beams to be incident upon the first pair of diffraction gratings from opposite directions, in a plane containing the first direction, with respect to a normal to the surface of the substrate, and for causing two light beams respectively corresponding to the second pair of light beams to be incident upon the second pair of diffraction gratings from opposite directions, in a plane containing the second direction, with respect to the normal to the surface of the substrate, thereby generating beam spots on the first and second pairs of diffraction gratings, beat signal detecting means for splitting a first diffracted light beam of a predetermined order, which is diffracted from the first pair of diffraction gratings in a diffraction direction perpendicular to the surface of the substrate, and a second diffracted light beam of a predetermined order, which is diffracted from the second pair of diffraction gratings in the same diffraction direction as that of the first diffracted light beam, into light beams respectively diffracted from corresponding ones of the diffraction gratings of the first and second pairs, and for detecting beat signals respectively corresponding to the light beams, first deviation detecting means for receiving first and second beat signals detected by the beat signal detecting means from the light beams diffracted from the first pair of diffraction gratings and for detecting a phase difference between the first and second beat signals to thereby detect a positional deviation of the diffraction gratings of the first pair, and second deviation detecting means for receiving third and fourth beat signals detected by the beat signal detecting means from the light beams diffracted from the second pair of diffraction gratings and for detecting a phase difference between the third and fourth beat signals to thereby detect a positional deviation of the diffraction gratings of the second pair.

In the case of a preferred embodiment of this positional deviation detecting apparatus, the four-way radiating means includes means for radiating the two pairs of coherent light beams in four directions in a plane parallel to the surface of the substrate.

Further, in the case of another preferred embodiment of the positional deviation detection apparatus, the first diffracted light beam and the second diffracted light beam are polarized light beams respectively having planes of polarization which are normal to each other. Further, the Dear signal detecting means includes a polarization beam splitter for separating the first diffracted light beam from the second diffracted light beam.

Moreover, in the case of still another preferred embodiment of the positional deviation detection apparatus, the light source means comprises a Zeeman laser.

Furthermore, in the case of yet another preferred embodiment of the positional deviation detection apparatus, the light source means comprises a single-frequency laser and an acousto-optical modulator for forming the two pairs of coherent light beams.

Additionally, in the case of a further preferred embodiment of the positional deviation detecting apparatus, the four-way radiating means includes at least a beam splitter, a polarization beam splitter and a wave plate.

Besides, in the case of an additional preferred embodiment of the positional deviation detecting apparatus, the beat signal detecting means includes one of a dichroic mirror and a diffraction grating, for splitting the light beams respectively diffracted from the diffraction gratings of the first and second pairs.

BRIEF DESCRIPTION OF THE DRAWINGS

Other features, objects and advantages of the present invention will become apparent from the following description of preferred embodiments with reference to the drawings in which like reference characters designate like or corresponding parts throughout the several views, and in which:

FIG. 10(A) is a diagram for illustrating another example of a diffraction grating mark;

FIG. 10(B) is a diagram for illustrating the configuration of an edge mirror in this case;

DETAILED DESCRIPTION OF THE PREFERRED EMBODIMENTS

Hereinafter, the preferred embodiments of the present invention will be described in detail by referring to the accompanying drawings.

Figure 1:
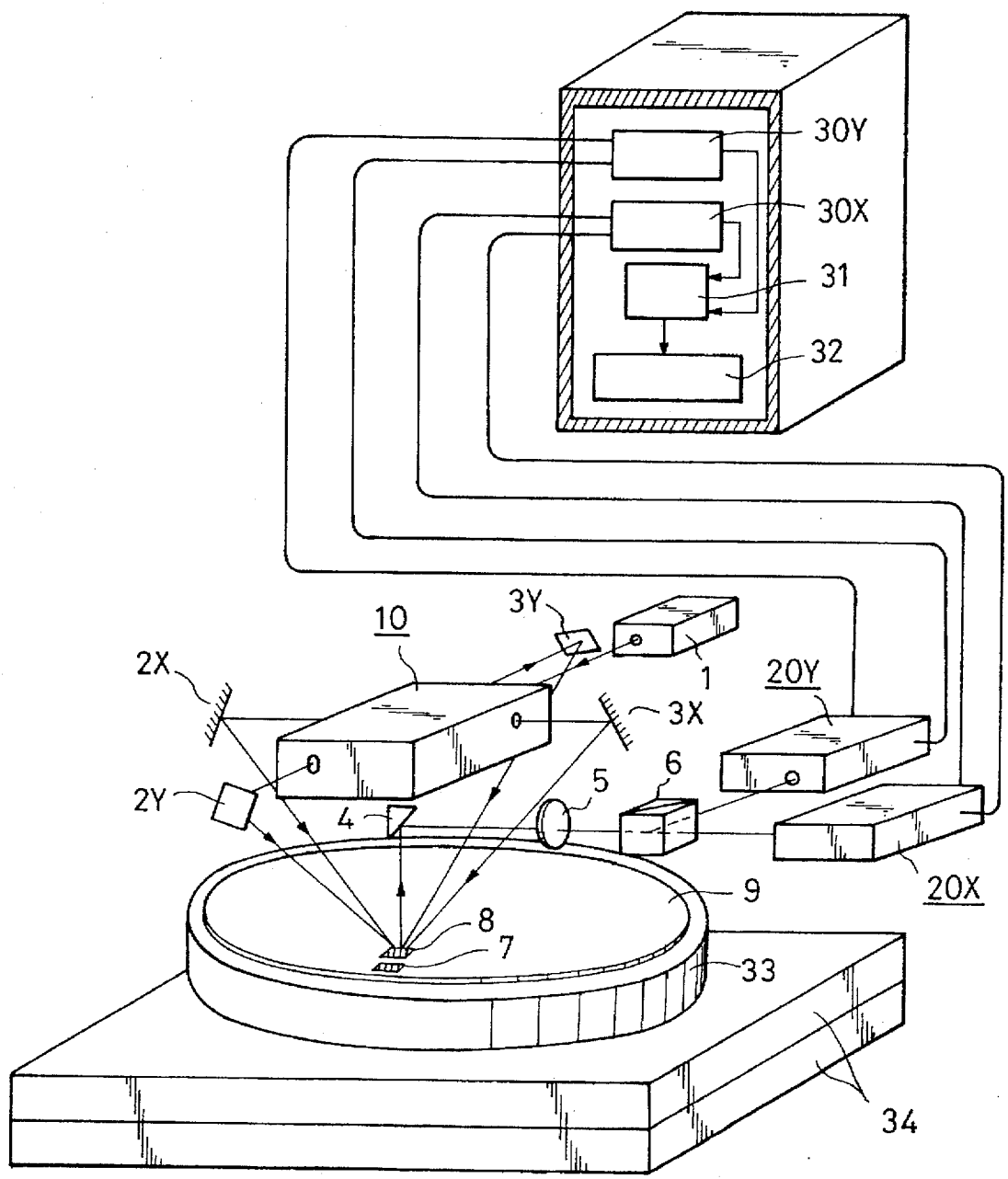
FIG. 1 is a schematic diagram for illustrating the configuration of a primary part of an apparatus for detecting a positional deviation by utilizing optical heterodyne interference according to a first embodiment of the present invention.

FIG. 1 is a schematic diagram for illustrating the configuration of a primary part of an apparatus for detecting a positional deviation by utilizing optical heterodyne interference according to a first embodiment of the present invention. This embodiment is a positional deviation detecting apparatus that utilizes optical heterodyne interference and is adapted to detect and evaluate positional deviations or differences in position between two diffraction gratings serving as patterns for evaluating printing alignment, which are printed on a semiconductor wafer by performing an exposure procedure two times, with high accuracy. For convenience of description, a system of X, Y and Z coordinates is established in such a manner that a face of the wafer is in an XY-plane.

In this figure, reference numeral 1 designates a Zeeman laser (namely, a light source means) for emitting laser light rays which have frequencies $f_1$ and $f_2$, respectively, and are coherent light rays serving as polarization components normal to each other and also having slightly different frequencies (or wavelengths).

Reference numeral 10 denotes a four-way radiating unit for separating laser light rays of frequencies $f_1$ and $f_2$, which are incident from the Zeeman laser 1 thereon, from each other and for separately emitting the light rays of a first pair of luminous fluxes of frequencies $f_1$ and $f_2$, which travel in the X-direction but are emitted in opposite orientations, and the light rays of a second pair of luminous fluxes of frequencies $f_1$ and $f_2$, which travel in the Y-direction but are emitted in opposite orientations. Namely, the four-way radiating unit 10 forms the light rays of two pairs of luminous fluxes, each of which consists of two coherent light rays respectively having slightly different frequencies, from light emitted from the light source and further emits the light rays of the luminous fluxes in four orientations. The light source means 1 and the four-way radiating unit 10 are elements comprising a four-way radiating means.

Reference characters 2X, 2Y, 3X and 3Y designate mirrors, each of which has a single-axis gate or flap mechanism. These mirrors are elements comprising an irradiating-angle setting means. Incidentally, the suffixes X and Y of these reference characters mean that the corresponding elements relate to the detection of positional deviations in the X- and Y-directions, respectively. Additionally, in this embodiment, the X-direction and Y-direction are set or referred to as a first direction and a second direction, respectively.

Reference numeral 9 denotes a semiconductor wafer (substrate) for evaluating the alignment accuracy.

Figure 5A:
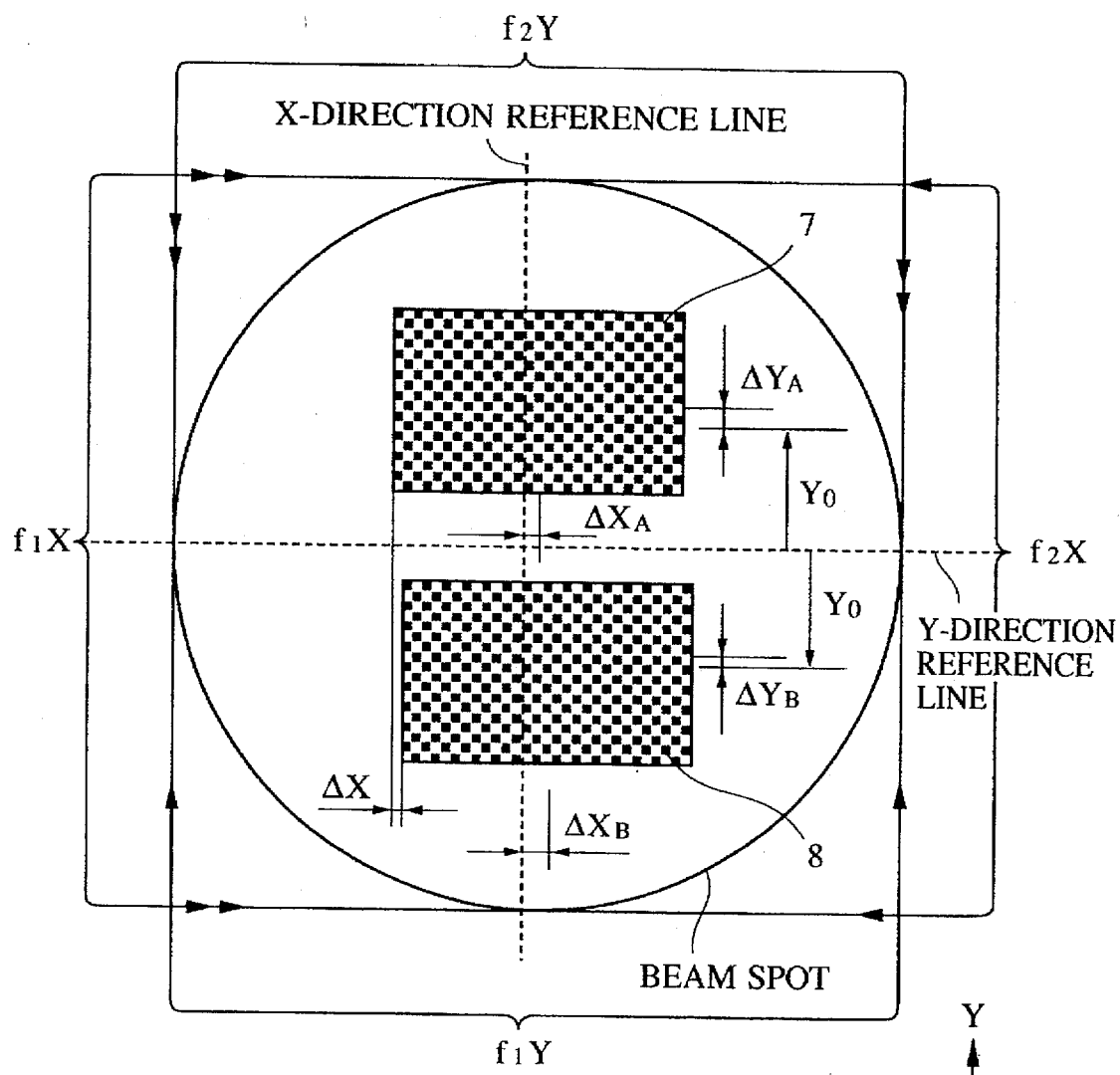
FIGS. 5(A) and 5(B) are diagrams for illustrating diffraction gratings formed on a semiconductor wafer.

Reference numerals 7 and 8 designate checkered diffraction gratings formed on the semiconductor wafer, each of which consists of linear elements extending in the X- and Y-directions, respectively. As illustrated in FIG. 5(A), the diffraction grating 7 is formed by performing a first printing process. Then, the diffraction grating 8 is formed by performing a second printing process. Thus, the pair of diffraction gratings 7 and 8 are formed. In the case of each of these diffraction gratings, the pitch in the X-direction is equal to that in the Y-direction and is denoted P in FIG. 5(B).

Figure 5B:
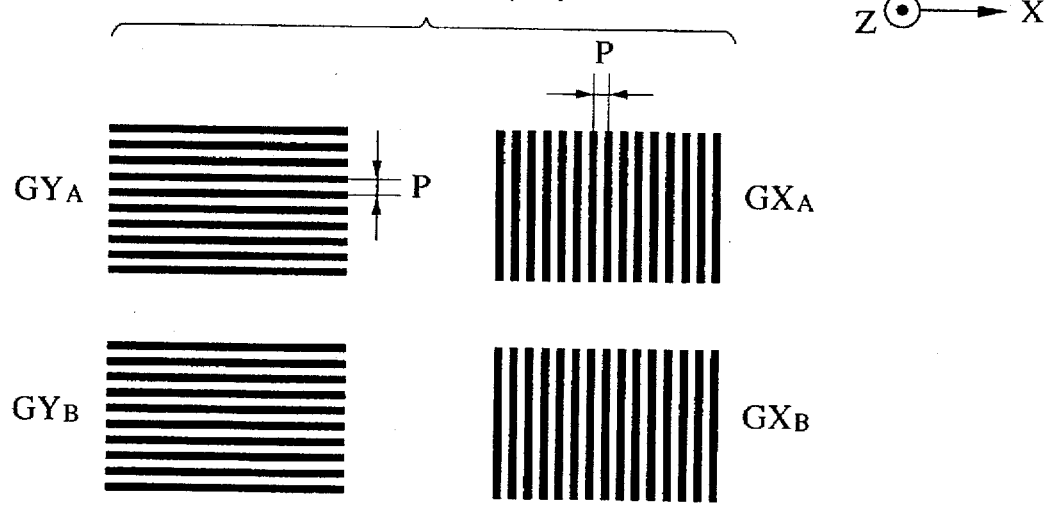

Incidentally, the checkered diffraction gratings 7 and 8 correspond to diffraction gratings obtained by respectively making diffraction gratings $GX_A$ and $GX_B$ (FIG. 5(B)) of a first pair and diffraction gratings $GY_A$ and $GY_B$ (FIG. 5(B)) of a second pair overlap with each other.

Reference numeral 4 designates a mirror; 5 a lens for guiding light diffracted by a diffraction grating to the sensor; and 6 a polarization beam splitter (hereafter abbreviated as PBS). The direction of polarization of diffracted light obtained by diffracting light (namely, a P-polarized-light beam for measuring a positional deviation in the X-direction), which is incident on the grating from the XY-plane, is normal to that of polarization of diffracted light obtained by diffracting light (namely, an S-polarized-light beam for measuring a positional deviation in the Y-direction), which is incident on the grating from the YZ-plane. Thus, the PBS 6 transmits the beam for measuring a positional deviation in the X-direction but reflects the beam for measuring a positional deviation in the Y-direction. This PBS 6 is an element comprising a luminous separating means.

Reference characters 20X and 20Y denote a unit for forming a beat signal corresponding to the X-direction and another unit for forming a beat signal corresponding to the Y-direction, respectively. The mirror 4, the lens 5, the PBS 6 and the beat-signal forming units 20X and 20Y are elements comprising a detecting means.

Reference characters 30X and 30Y respectively designate an X-direction phase difference meter and a Y-direction phase difference meter, each of which receives two beat signals and outputs the corresponding phase difference $\Delta\phi_X$ or $\Delta\phi_Y$ between the two beat signals. Reference numeral 31 denotes a computing unit (namely, a computing means) which calculates a deviation in relative positions from outputs of the phase difference meters; and 32 a display unit for displaying the amount of the positional deviation.

Reference numeral 33 designates a θ-stage for turning the semiconductor wafer 9; and 34 an XY-stage for moving the semiconductor wafer 9 in the X- or Y-direction.

The semiconductor wafer 9 for evaluation is held on the θ-stage 33 provided upon the XY-stage 34 so as to be movable to a measuring position of the detecting means fixed by the XY-stage 34.

Next, operation of the first embodiment will be described. Laser light emitted from the Zeeman laser 1 is incident on the four-way radiating unit 10. Then, light rays of the first pair of luminous fluxes of slightly different frequencies $f_1X$ and $f_2X$ (or wavelengths), which travel in the X-direction but are emitted in opposite orientations, and the light rays of the second pair of luminous fluxes of slightly different frequencies $f_1Y$ and $f_2Y$, which travel in the Y-direction but are emitted in opposite orientations, are formed by this unit. Subsequently, the light rays of these luminous fluxes are emitted by the four-way radiating unit 10 in four orientations. Further, all of the light rays of the luminous fluxes emitted in the four orientations are emitted into a plane parallel to the surface of the substrate.

Figure 2:
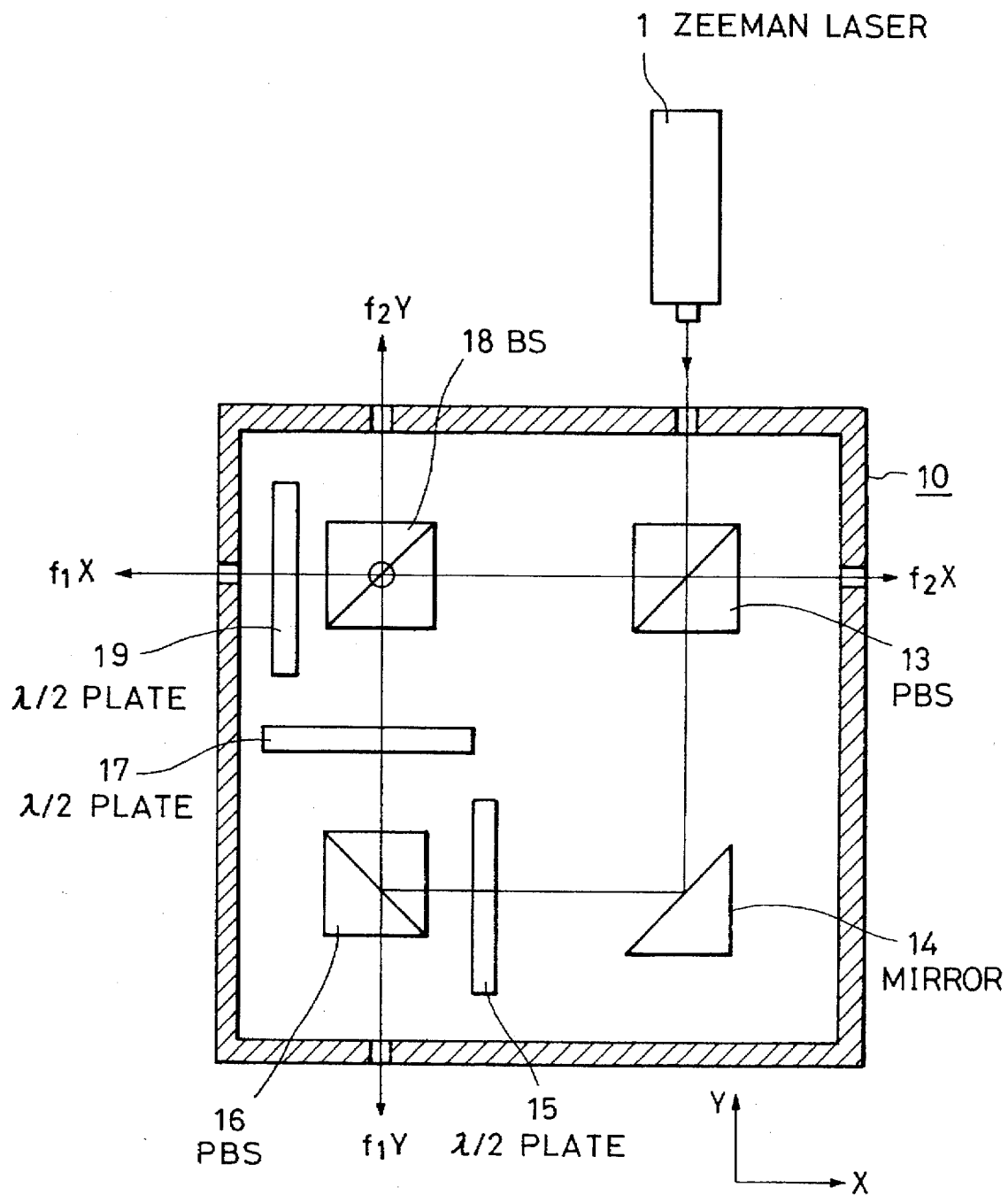
FIG. 2 is a schematic diagram for illustrating the configuration of a primary part of a first example of a four-way radiating unit of FIG. 1.

FIG. 2 is a schematic diagram for illustrating the configuration of a primary part of a first example of the four-way radiating unit of FIG. 1. In FIG. 2, reference numeral 10 denotes the first example of this four-way radiating unit; 13 and 16 polarization beam splitters (PBSs); 14 a mirror; 15, 17 and 19 half-wave plates (λ/2 plates); and 18 a beam splitter (BS).

Hereinafter, operation of this unit will be described. The light rays of the luminous fluxes containing two wavelengths, which are emitted from the Zeeman laser 1, are split by the PBS 13 into P-polarized light having the frequency $f_2$, which is transmitted by the PBS 13, and S-polarized light having the frequency $f_1$, which is reflected thereby. The transmitted light of the P-polarized-light luminous flux is deflected by the mirror 14. Then, this P-polarized light is converted into S-polarized light through the half-wave plate 15. Subsequently, this S-polarized light is reflected by the PBS 16. Thereafter, this reflected light is again converted back by the half-wave plate 17 into P-polarized light which is further incident on the BS 18. Thereby, this P-polarized light is split therein into two light rays. Consequently, the light rays of two light fluxes, which have frequencies $f_2X$ and $f_2Y$ and travel in directions perpendicular to each other, respectively, are obtained.

On the other hand, the light of the S-polarized-light luminous flux, which is reflected by the PBS 13, is split by the BS 18 into two light rays. Then, the light ray transmitted by the BS 18 passes through the half-wave plate 19 and is emitted therefrom as that of a P-polarized-light luminous flux having the frequency $f_1X$. The light of the luminous flux reflected by the BS 18 passes through the half-wave plate 17 and thus becomes that of a P-polarized-light luminous flux. The light ray of this P-polarized-light luminous flux is then transmitted by the PBS 16. As a result, the light ray of a luminous flux having the frequency $f_1Y$ is emitted therefrom.

Incidentally, immediately after being emitted from the four-way radiating unit 10, all of the oscillations of the electrical field vector of the light are oriented in the XY-plane by the action of the half-wave plates of the four-way radiating unit 10. Among the light rays of the luminous fluxes emitted from the four-way radiating unit 10, the light rays of the first pair of the luminous fluxes having frequencies $f_1X$ and $f_2X$ traveling in the X-direction are deflected by the mirrors 2X and 3X, respectively, and are then incident on the pair of the diffraction gratings 7 and 8, which contain the first pair of the diffraction gratings, from opposite directions with respect to the normal to the surface of the substrate in the XZ-plane. At that time, the respective luminous fluxes result in beam spots which overlap with each other and have sizes sufficient to cover the two gratings. On the other hand, the light rays of the second pair of the luminous fluxes having frequencies $f_1Y$ and $f_2Y$ traveling in the Y-direction are deflected by the mirrors 2Y and 3Y, respectively, and are then incident on the pair of the diffraction gratings 7 and 8, which include the second pair of the diffraction gratings, from opposite directions with respect to the normal to the surface of the substrate in the YZ-plane. At that time, the respective luminous fluxes result in beam spots which overlap with each other and have sizes sufficient to cover the two gratings. Therefore, the beam spots originating from the first pair of the luminous fluxes overlap with those originating from the second pair of the luminous fluxes on the surface of the substrate, as illustrated in FIG. 5(A).

At that time, the angle $\theta_{in}$ of incidence of the laser light upon the mirrors 2X, 3X, 2Y and 3Y is set by the gate or flap mechanism in such a manner that the diffracted light having a predetermined order is diffracted by the pair of the diffraction gratings 7 and 8 upwardly and vertically from the semiconductor wafer 9. This angle $\theta_{in}$ of incidence can be obtained by $$P \cdot \sin\theta_{in} = n \cdot \lambda$$

where λ represents the wavelength of the laser light; and n the order of diffraction. For example, in the case where the pitch P=2 μm, a He-Ne laser (λ=63 nm) is used and ±first-order diffracted light is utilized, the angle $\theta_{in}$ of incidence is about 18.5 degrees.

The light rays of the luminous fluxes having frequencies $f_1X$, $f_2X$, $f_1Y$ and $f_2Y$, with which the diffraction gratings 7 and 8 are irradiated from four directions, are diffracted by the diffraction gratings 7 and 8. The diffracted light rays of the predetermined order pass through nearly the same optical path vertical to the surface of the semiconductor wafer and are incident on the detecting means. (The light of the predetermined order diffracted by the first pair of the diffraction gratings is referred to as first diffracted light, and the light of the predetermined order diffracted by the second pair of the diffraction gratings is referred to as second diffracted light.) Both of the first and second diffracted light rays are deflected by the mirror 4 and are then incident on the PBS 6 through the lens 5. A beam for measuring a positional deviation in the X-direction is P-polarized light with respect to the PBS 6 and is thus transmitted by the PBS 6. Then, the transmitted light is guided to the beat signal forming unit 20X (namely, an element of the first detecting means). On the other hand, a beam for measuring a positional deviation in the Y-direction is S-polarized light with respect to the PBS 6 and is thus transmitted by the PBS 6. Then, the transmitted light is guided to the beat signal forming unit 20Y (namely, an element of the second detecting means).

Figure 3:
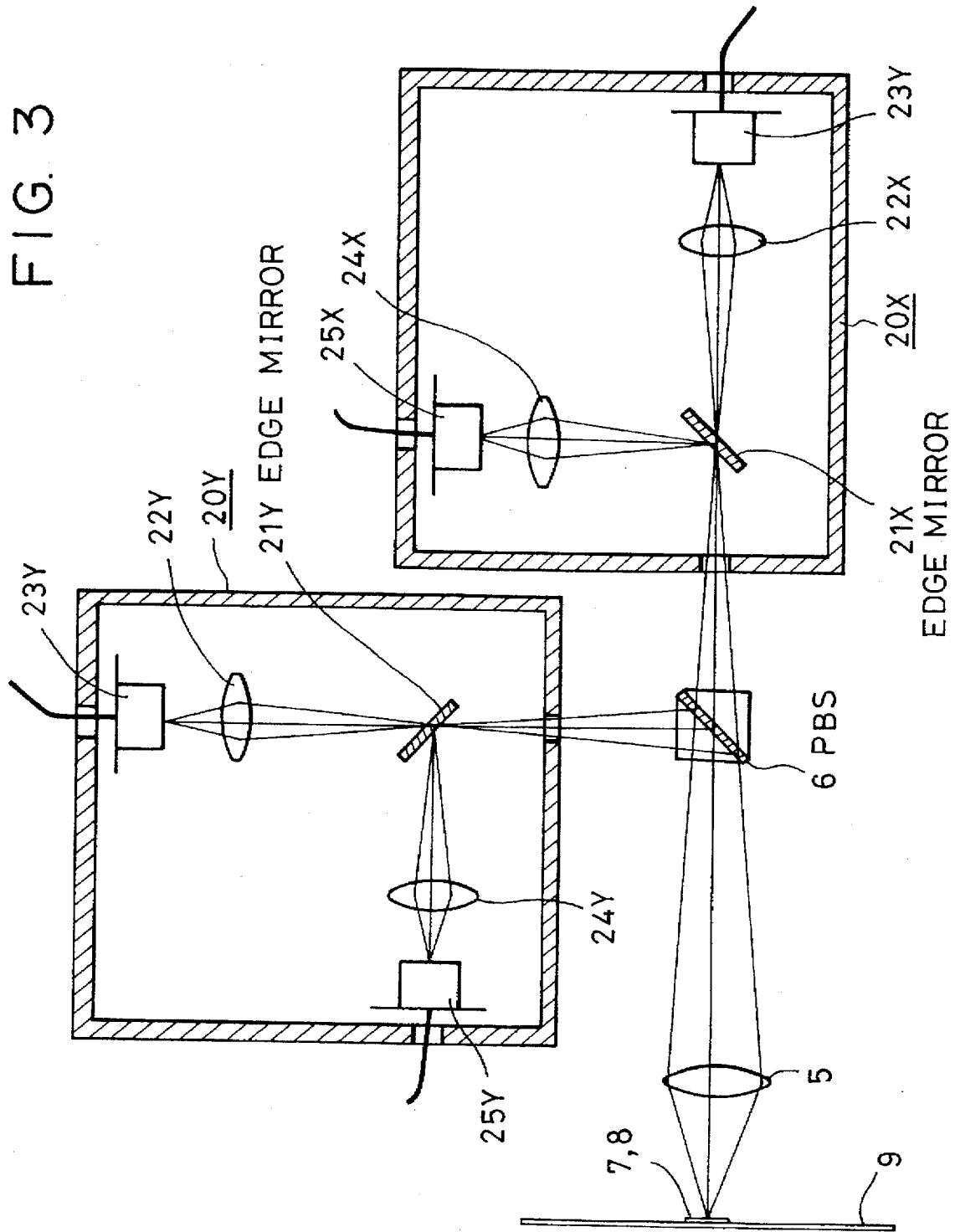
FIG. 3 is a schematic diagram for illustrating the configuration of a primary part of a first example of a beat signal forming unit of FIG. 1.

FIG. 3 is a schematic diagram for illustrating the configuration of a primary part of a first example of each of the beat signal forming units 20X and 20Y. Further, reference numerals 21X and 21Y denote edge mirrors, each of which is placed in such a manner as to bear a conjugate relation to the corresponding one of the diffraction gratings 7 and 8 with respect to the lens 5 and splits incident light into light diffracted by the diffraction grating 7 and light diffracted by the diffraction grating 8; 22X, 24X, 22Y and 24Y lenses; and 23X, 25X, 23Y and 25Y sensors which detect beat signals obtained from diffracted light. These sensors are located in such a manner as to bear a conjugate relation to the diffraction gratings 7 and 8 and the edge mirrors 21X and 21Y, respectively.

Hereinafter, operation of the beat signal forming units 20X and 20Y will be described. Light diffracted by the diffraction gratings 7 and 8 forms images on the edge mirrors 21X and 21Y as illustrated in FIG. 4(A). Light from a first-order image 7' of the diffraction grating 7 is transmitted by the edge mirrors 21X and 21Y. Then, the transmitted light is received by the sensors 23X and 23Y through the lenses 22X and 22Y, respectively, and a first beat signal is obtained by each of the sensors 23X and 23Y. On the other hand, the light rays diffracted by the diffraction grating 8 are reflected by the mirror portions of the edge mirrors 21X and 21Y. The reflected light rays are received by the sensors 25X and 25Y through the lenses 24X and 24Y, respectively. Thus, a second beat signal is obtained by each of the sensors 25X and 25Y. The sensors bear a conjugate relation to the surface of the semiconductor wafer. Therefore, this system becomes insensitive to the tilt of the semiconductor wafer 9.

Figure 4B:
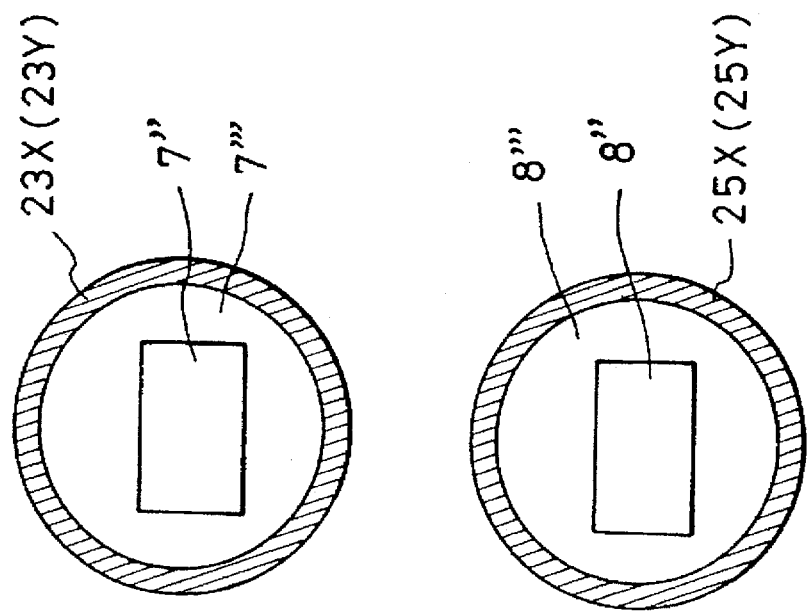
FIG. 4(B) is a diagram for illustrating how an image is formed on a sensor portion from light diffracted by diffraction gratings of the first example of the beat signal forming unit.
Figure 4A:
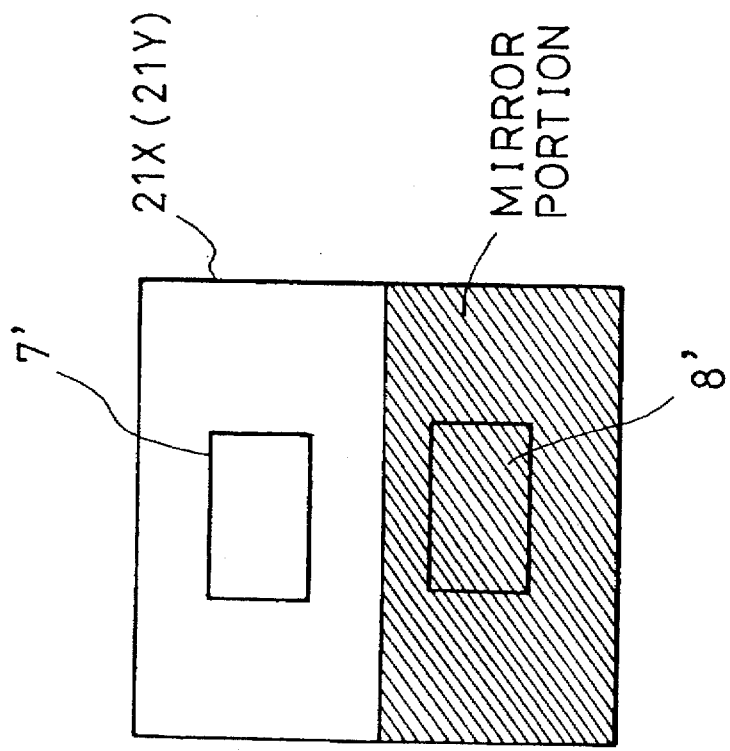
FIG. 4(A) is a diagram for illustrating how an image is formed on an edge mirror portion from light diffracted by diffraction gratings of the first example of the beat signal forming unit.

It is preferable that the image-formation magnification of the system consisting of the lenses 5, 22X, 24X, 22Y and 24Y is set in Such a manner that second-order images 7" and 8" are within the effective light receiving regions 7" and 8" of the sensors 23X, 25X, 23Y and 25Y, as illustrated in FIG. 4(B).

A method of the present invention for detecting a positional deviation by utilizing optical heterodyne interference will now be described.

Figure 6:
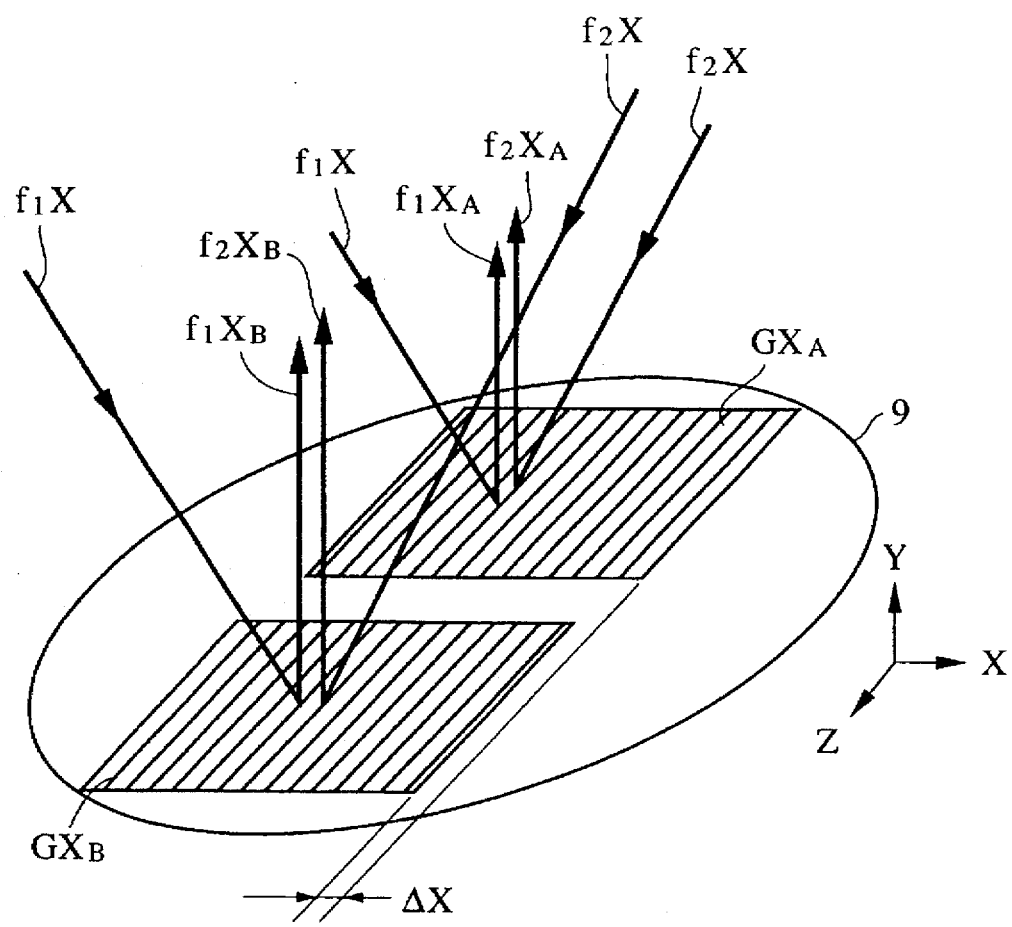
FIG. 6 is a diagram for illustrating incident light on and diffracted light from a pair of diffraction gratings for detecting a deviation in the X-direction.

FIG. 6 is a diagram for illustrating the arrangement of patterns for measuring a positional deviation in a single direction (namely, the X-direction) and incident light on and diffracted light from a pair of diffraction gratings, for convenience of drawing. Patterns to be measured are the diffraction gratings $GX_A$ and $GX_B$ formed on the substrate 9. The diffraction grating $GX_A$ is the first diffraction grating formed on the surface of the wafer at the first exposure. The diffraction grating $GX_B$ is the second diffraction grating formed on the surface of the wafer at the second exposure. Both of the pitches of these two diffraction gratings are equal to P. The following deviation $\Delta X$, however, is generated in the direction of the arrows, namely, in the X-direction between these diffraction gratings.

$$\Delta X = \Delta X_B - \Delta X_A$$

where $\Delta X_A$ and $\Delta X_B$ represent positional deviations in the X-direction of the diffraction gratings $GX_A$ and $GX_B$ from the same reference line. Further, it is assumed that $\Delta X$ never exceeds the pitch P.

Here, the entire surfaces of the two diffraction gratings $GX_A$ and $GX_B$ are irradiated with two light rays $f_1 X$ and $f_2 X$, which have slightly different frequencies $f_1$ and $f_2$ and initial phases $\phi_{01}$ and $\phi_{02}$, respectively. As illustrated in this figure, the light ray $f_1 X$ is incident from the left and the light ray $f_2 X$ is incident from the right at angles of incidence, the absolute values of which are equal to each other, respectively.

In this case, the complex amplitudes $E_1$ and $E_2$ of the light rays $f_1 X$ and $f_2 X$ are respectively expressed by $$E_1 = A_0 exp\{i(\omega_1 t + \phi_{01})\} \quad (2)$$

$$E_2 = B_0 exp\{i(\omega_2 t + \phi_{02})\} \quad (3)$$

where $$\omega_1 = 2\pi \cdot f_1, \quad \omega_2 = 2\pi \cdot f_2 \quad (4)$$

Further, consider $f_1 X_A$ and $f_1 X_B$ to denote +first-order diffracted light rays corresponding to the diffraction gratings $GX_A$ and $GX_B$. Moreover, let $f_2 X_A$ and $f_2 X_B$ denote -first-order diffracted light rays corresponding to the diffraction gratings $GX_A$ and $GX_B$. Furthermore, these light rays are expressed in complex-amplitude representation as follows.

$$E_A(f_1) = A_1 exp\{i(\omega_1 t + \phi_{01} + \phi_{XA})\} \quad (5)$$

$$E_A(f_2) = A_2 exp\{i(\omega_1 t + \phi_{02} - \phi_{XA})\} \quad (6)$$

$$E_B(f_1) = B_1 exp\{i(\omega_1 t + \phi_{01} + \phi_{XB})\} \quad (7)$$

$$E_B(f_2) = B_2 exp\{i(\omega_2 t + \phi_{02} - \phi_{XB})\} \quad (8)$$

where $E_A(f_1)$, $E_A(f_2)$, $E_B(f_1)$ and $E_B(f_2)$ designate the complex amplitudes of the light rays $f_1 X_A$, $f_1 X_B$, $f_2 X_A$ and $f_2 X_B$, respectively. (Incidentally, the diffracted light rays $f_1 X_A$, $f_1 X_B$, $f_2 X_A$ and $f_2 X_B$ are the first diffracted light as previously defined).

$$\phi_{XA} = 2\pi \cdot \Delta X_A / P \quad (9)$$

$$\phi_{XB} = 2\pi \cdot \Delta X_B / P \quad (10)$$

where $\phi_{XA}$ and $\phi_{XB}$ represent the amounts of phases respectively corresponding to those of the deviations $\Delta X_A$ and $\Delta X_B$ in the X-direction of the diffraction gratings $GX_A$ and $GX_B$ from the reference line (see FIG. 5(A)).

Here, the interference between the diffracted light rays $f_1 X_A$ and $f_2 X_A$ from the diffraction grating $GX_A$ and the interference between the diffracted light rays $f_1 X_B$ and $f_2 X_B$ from the diffraction grating $GX_B$ are made to occur, and the interference light intensities $I_A$ and $I_B$ are expressed as follows.

$$I_A = |E_A(f_1) + E_A(f_2)|^2 = A_1^2 + A_2^2 + 2A_1 A_2 cos\{(\omega_1 - \omega_2)t + (\phi_{01} - \phi_{02}) + 2\phi_{XA}\} \quad (11)$$

$$I_B = |E_B(f_1) + E_B(f_2)|^2 = B_1^2 + B_2^2 + 2B_1 B_2 cos\{(\omega_1 - \omega_2)t + (\phi_{01} - \phi_{02}) + 2\phi_{XB}\} \quad (12)$$

Among terms of the equations representing the intensities $I_A$ and $I_B$, the terms $(A_1^2 + A_2^2)$ and $(B_1^2 + B_2^2)$ are d.c. components. The a.c. components of the intensities $I_A$ and $I_B$ are represented by the beat signals. Further, the products $2A_1 A_2$ and $2B_1 B_2$ represent the amplitudes of the beat signals, respectively. $I_{XA}$ and $I_{XB}$ represent the two beat signals. Further, the amplitudes of these beat signals are assumed to be $A_{XA}$ and $A_{XB}$. Moreover, the initial phase terms $(\phi_{01} - \phi_{02})$ are omitted. Thus, the following equations are obtained.

$$I_{XA} = A_{XA} cos\{(\omega_1 - \omega_2)t + 2\phi_{XA}\} \quad (13)$$

$$I_{XB} = A_{XB} cos\{(\omega_1 - \omega_2)t + 2\phi_{XB}\} \quad (14)$$

Figure 7:
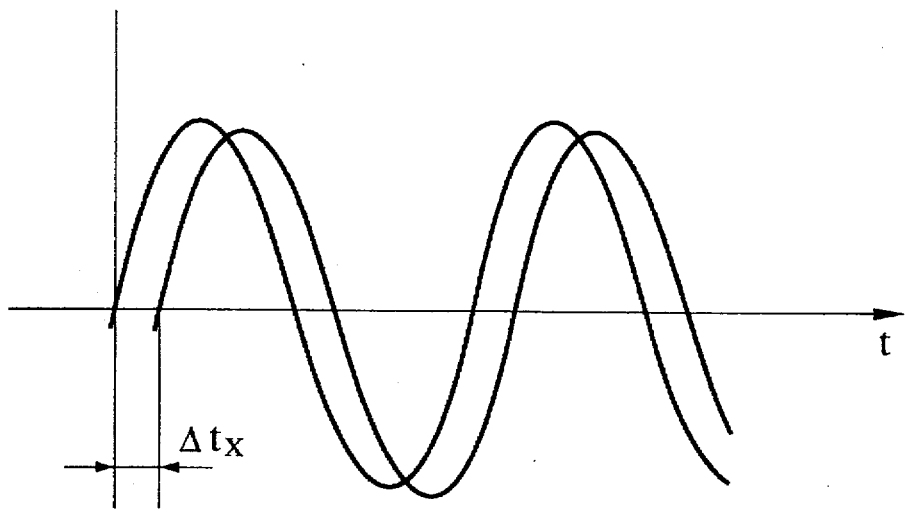
FIG. 7 is a diagram for illustrating two beat signals respectively obtained from sensors.

The beat signals expressed by the equations (13) and (14) are expressed as being subjected to the time-dependent phase modulation in connection with the amounts of the deviations $\phi_{XA}$ and $\phi_{XB}$ of the diffraction gratings $GX_A$ and $GX_B$. Therefore, if one of the two beat signals is employed as a reference signal and the other is employed as a measured signal and the difference in time (namely, the time lag) $\Delta t_X$ between these beat signals is detected as illustrated in FIG. 7, the difference $\Delta \phi_X$ in phase (namely, the phase difference) between the two beat signals, which is given by the following equation, can be detected with high accuracy using what is called a heterodyne interference measurement.

$$\Delta \phi_X = 2\phi_{XB} - 2\phi_{XA} \quad (15)$$

Incidentally, the phase difference $\Delta \phi_X$ is obtained from the time lag $\Delta t_X$ by performing a calculation from the following equation.

$$\Delta \phi_X = (\omega_1 - \omega_2) \cdot \Delta t_X \quad (16)$$

In the case of the heterodyne interference method, the phase difference between the two signals is detected at one time. Thus, the initial phase of the light is eliminated. Even if there is a difference in d.c. component between the signals, or if a change in amplitudes of the signals occurs, a result of the measurement is not affected. The difference $\Delta t_X$ in time can be detected with high accuracy by using a phase difference meter which uses a lock-in amplifier or the like. Therefore, the phase difference $\Delta \phi_X$ also can be measured with high accuracy.

Then, the amount of the positional deviation $\Delta X$ between the diffraction gratings is calculated by using the following equation from the phase difference detected in this manner.

$$\Delta X = P \cdot \Delta \phi_X / 4\pi \quad (17)$$

If the amount of the positional deviation between the grating $GX_A$, which is the diffraction grating pattern printed by the first exposure, and the grating $GX_B$, which is the diffraction grating pattern printed by the second exposure, is determined according to the aforementioned principle, the alignment accuracy between the patterns formed as the result of the first and second exposures performed by the semiconductor equipment or the like can be detected.

In the case of the apparatus of the present invention, the positional deviation in a direction between the diffraction gratings $GX_A$ and $GX_B$ is obtained by utilizing the aforementioned detection method.

First, the detection of the positional deviation in the X-direction therebetween will be described. The sensor 23X detects the beat signal $I_{XA}$ photoelectrically. Further, the sensor 25X detects the beat signal $I_{XB}$ photoelectrically. These signals are shown in FIG. 7, in which the leading curve represents reference signal $I_{XA}$ and the trailing curve represents measured signal $I_{XB}$.

The phase difference meter 30X detects the difference $\cdot \Delta t_X$ in time between the beat signals therefrom and calculates the phase difference $\Delta \phi_X$ from the following equation.

$$\Delta \phi_X = (\omega_1 - \omega_2) \cdot \Delta t_X \quad (18)$$

Next, the detection of the positional deviation in the X-direction therebetween will be described.

Here, it is assumed that the position of the diffraction grating 7 is shifted from the reference line in the Y-direction by $(\Delta Y_A + Y_0)$ and that the position of the diffraction grating 8 is shifted from the reference line in the Y-direction by $(\Delta Y_B - Y_0)$ (see FIG. 5(A)).

The beat signal $I_{YA}$ detected by the sensor 23Y photoelectrically is expressed as follows by assuming that the amplitude of this beat signal is $A_{YA}$ and that the initial phase term is omitted.

$$I_{YA} = A_{YA} \cos\{(\omega_1 - \omega_2) \cdot t + 2\phi_{YA}\} \quad (19)$$

Further, the beat signal $I_{YB}$ detected by the sensor 25Y photoelectrically is expressed as follows by assuming that the amplitude of this beat signal is $A_{YB}$ and that the initial phase term is omitted.

$$I_{YB} = A_{YB} \cos\{(\omega_1 - \omega_2) \cdot t + 2\phi_{YB}\} \quad (20)$$

Here, note that $$\phi_{YA} = 2\pi \cdot (\Delta Y_A + Y_0)/P \quad (21)$$

$$\phi_{YB} = 2\pi \cdot (\Delta Y_B - Y_0)/P \quad (22)$$

The phase difference meter 30Y detects from the two beat signals the difference $\Delta t_Y$ in time therebetween. Further, the phase difference $\Delta \phi_Y$ is computed from the following equation.

$$\Delta \phi_Y = (\omega_1 - \omega_2) \cdot \Delta t_Y \quad (23)$$

Meanwhile, $$\Delta \phi_Y = 2\phi_{YB} - 2\phi_{YA} = 4\pi\{(\Delta Y_B - \Delta Y_A) - (Y_0 + Y_0)\}/P = 4\pi(\Delta Y - 2Y_0)/P \quad (24)$$

Therefore, the phase difference $\Delta \phi_Y$ contains a component of the phase difference, which corresponds to the positional deviation in the Y-direction of the diffraction grating 8 from the diffraction grating 7, and another component of the phase difference, which is caused by an initial offset amount $2Y_0$ in the Y-direction, which is preliminarily given to a mask (or a reticle) to be exposed (see FIG. 5(A)).

Figure 8:
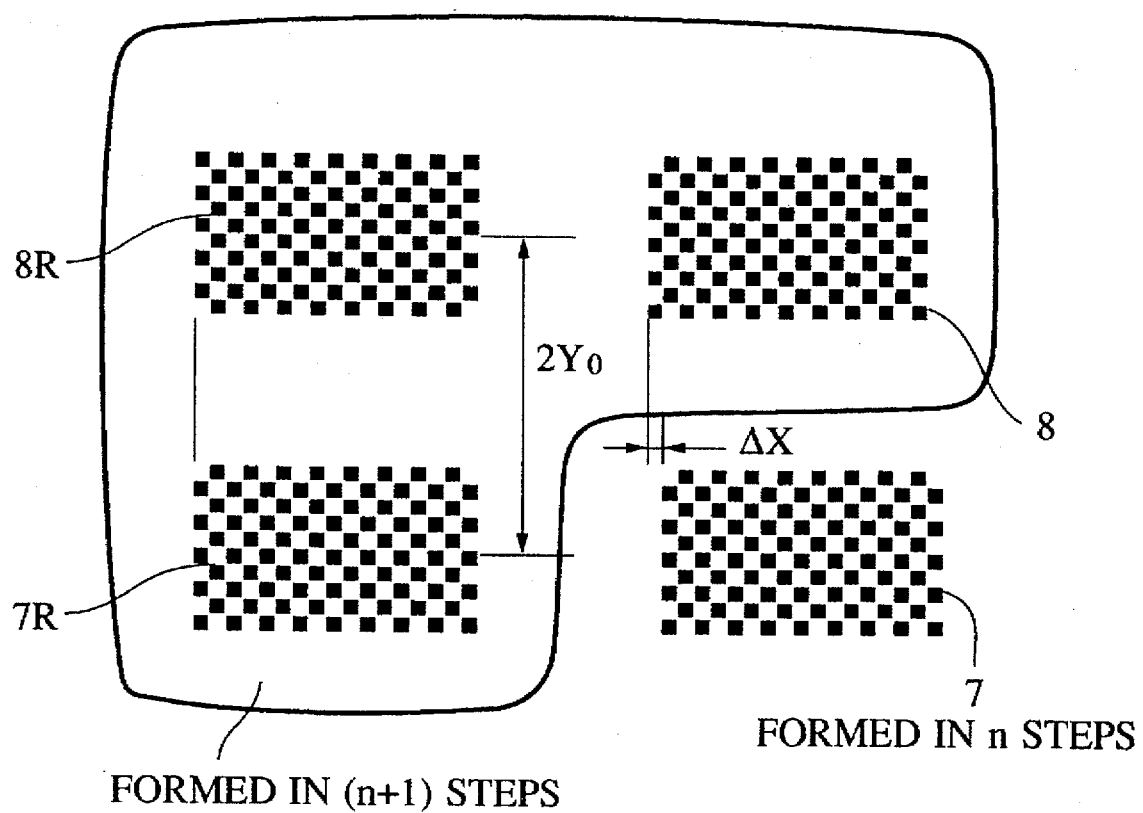
FIG. 8 is a diagram for illustrating a reference mark.

Next, a method for correcting this offset amount and other errors will be described. In the case of this embodiment, at least one of the reference marks (namely, the pair of the diffraction gratings 7R and 8R), whose designed deviation amount (in this case, there is no deviation in the X-direction but the deviation amount in the Y-direction is $2Y_0$) on a mask (or a reticle) is already known in the process of printing the diffraction gratings 7 and 8 as illustrated in FIG. 8, is formed during an exposure shot, for the purpose of correcting offsets of the optical and electrical systems, the initial offset in the Y-direction and an error caused due to the rotation of the evaluating pattern around the Z-axis. This reference mark (namely, one of the pair of the diffraction gratings 7R and 8R) is measured for reference purposes, and thus, the correction is performed.

Let $\Delta \phi_{XO}$ and $\Delta \phi_{YO}$ designate phase differences obtained by measuring the reference marks (namely, the pair of the diffraction gratings 7R and 8R and using the phase difference meters 30X and 30Y, respectively. The computing unit 31 obtains alignment errors $\Delta X_e$ and $\Delta Y_e$ between the two processes respectively corresponding to the X- and Y-directions from the following equations.

$$\Delta X_e = P \cdot (\Delta \phi_X - \Delta \phi_{XO}) \quad (25)$$

$$\Delta Y_e = P \cdot (\Delta \phi_Y - \Delta \phi_{YO}) \quad (26)$$

Further, the results are displayed by the display unit 32 as the amounts of the deviation in the X- and Y-directions.

Incidentally, if outputs of the beat signal forming units 20X and 20Y are introduced into the phase difference meter 30X by using an electrical switching mechanism, it is sufficient for the apparatus to have the single phase difference meter 30X.

Additionally, the beat signal forming unit 20X and the phase difference meter 30X are elements comprising the first detecting means. Further, the beat signal forming unit 20Y and the phase difference meter 30Y are elements comprising the second detecting means.

In the case of this embodiment, the four-way radiating unit 10 emits the light rays respectively corresponding to the two pairs of the luminous fluxes in a plane parallel to the surface of the substrate. Moreover, two light rays, which travel in opposite directions and have frequencies slightly different from each other, are emitted correspondingly to each of the pairs of the luminous fluxes.

Therefore, a compact illumination system can be realized by employing such four-way radiating means. Further, the optical path of a light ray extends in the same plane between the light source and the four-way radiating means. Consequently, the alignment of the optical components of the four-way radiating means, and that of the light source and the four-way radiating means can be achieved easily and accurately.

Further, the alignment of the mirrors 2X, 3X, 2Y and 3Y for determining the direction in which the diffracted light rays to be made to interfere with each other travel, and for prescribing the irradiation angle and position, which directly affect the measurement accuracy, can be easily attained with good accuracy. Furthermore, in this embodiment, the pair of the diffraction gratings for measurement, which are placed at the same position on the semiconductor wafer 9, can be measured simultaneously from two directions, namely, the X- and Y-directions. Consequently, the throughput in measurement can be enhanced.

Additionally, in this positional deviation detecting apparatus, namely, in the first embodiment, ±first-order diffracted light is utilized. Nevertheless, light of another order can be utilized.

Figure 9:
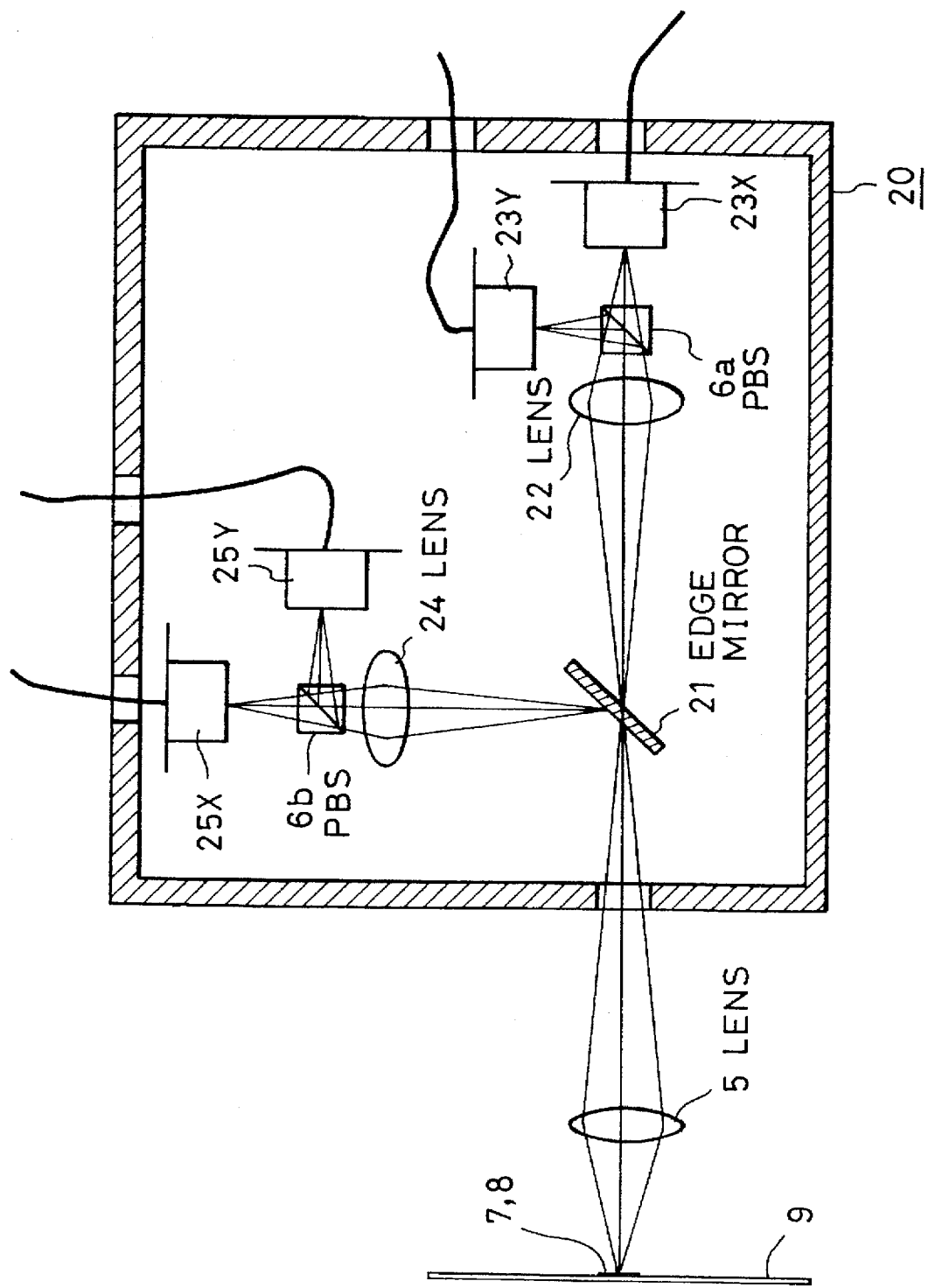
FIG. 9 is a schematic diagram for illustrating the configuration of a primary part of a second example of the beat signal forming unit.

FIG. 9 is a schematic diagram for illustrating the configuration of the primary part of a second example of the beat signal forming unit. In this figure, reference numeral 20 designates the beat signal forming unit in this example. In the case of the first example of the beat signal forming unit of FIG. 3, the light rays diffracted from the diffraction gratings 7 and 8 are separated from the edge mirrors 21X and 21Y after the beam for measuring the deviation in the X-direction is separated from the beam for measuring the deviation in the Y-direction by the PBS 6. In the second example, the separation of light rays diffracted from the diffraction gratings 7 and 8 is performed at the edge mirror 21 in advance. Subsequently, the separated light rays pass through the lenses 22 and 24. Then, the beam for measuring the deviation in the X-direction and the beam for measuring the deviation in the Y-direction are separated from the light rays by the PBSs 6a and 6b, respectively. Thereafter, the beams are detected by the sensors 23X, 23Y, 25X and 25Y photoelectrically.

Incidentally, in this example, the mirror 4, the lens 5 and the beat signal forming unit 20 are elements comprising the detecting means.

Additionally, the lens 22, the PBS 6a and the sensors 23X and 23Y are elements comprising the detecting means A. Further, the lens 24, the PBS 6b and the sensors 25X and 25Y are elements comprising the detecting means B.

FIG. 10(A) is a diagram for illustrating another example of a set of the diffraction gratings. This example consists of linear diffraction gratings 7X and 8X for measuring a deviation in the X-direction and linear diffraction gratings 7Y and 8Y for measuring a deviation in the Y-direction. Further, the entire diffraction gratings are irradiated with the light rays respectively corresponding to four luminous fluxes at one time. Incidentally, the pair of the diffraction gratings 7X and 8X correspond to the pair of the diffraction gratings $GX_A$ and $GX_B$ of FIG. 5(B). Further, the pair of the diffraction gratings 7Y and 8Y correspond to the pair of the diffraction gratings $GY_A$ and $GY_B$ of FIG. 5(B). In this case, if the first example of the beat signal forming unit of FIG. 3 is employed, the edges of the edge mirrors 21X and 21Y are aligned in the direction of the marks, respectively, as illustrated in FIG. 10(B).

Figure 11:
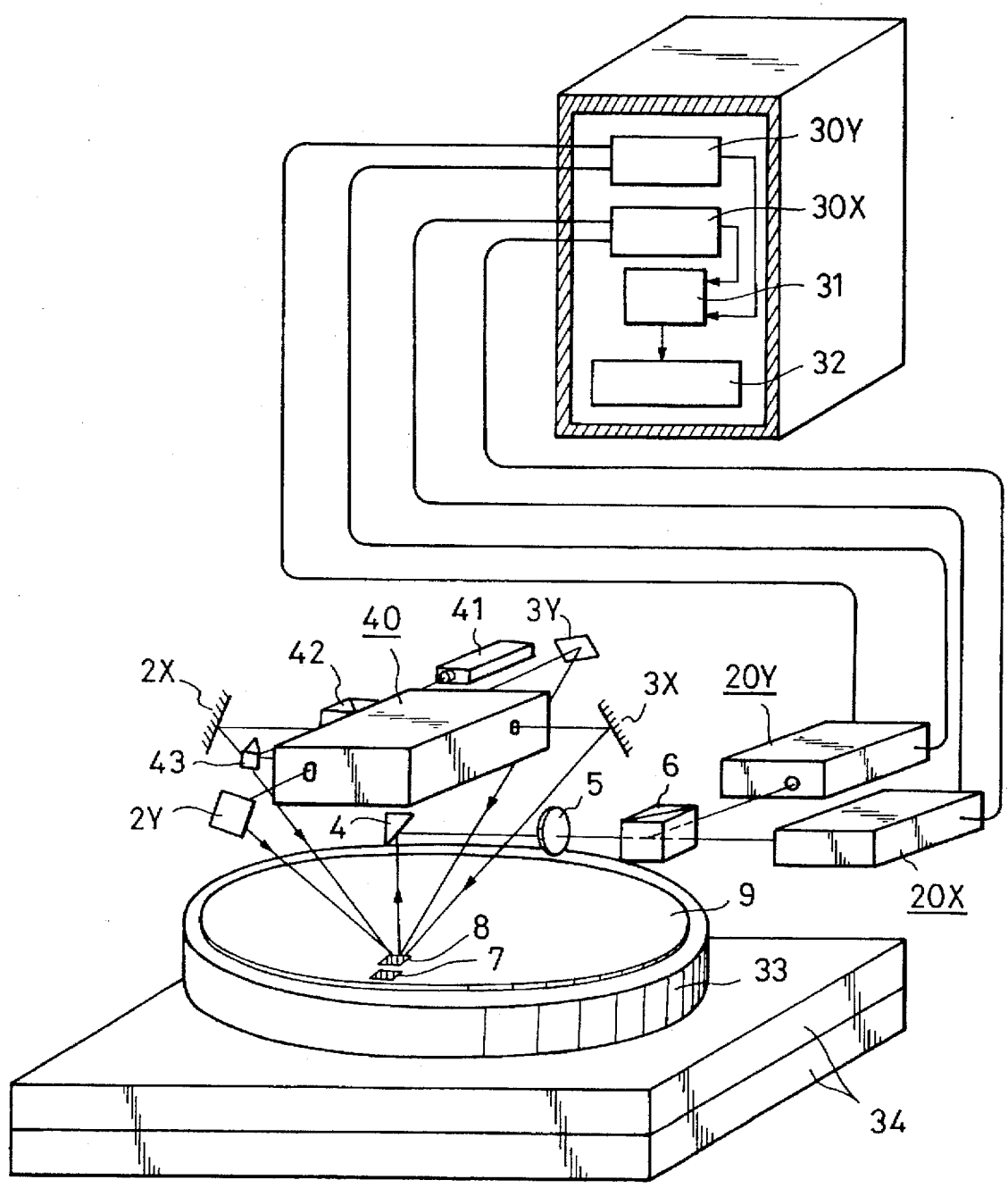
FIG. 11 is a schematic diagram for illustrating the configuration of a primary part of another apparatus for detecting a positional deviation by utilizing optical heterodyne interference according to a second embodiment of the present invention.

FIG. 11 is a schematic diagram for illustrating the configuration of the primary part of another apparatus for detecting a positional deviation by utilizing optical heterodyne interference according to the present invention, namely, the second embodiment of the present invention. The second embodiment is different in structure from the first embodiment only with respect to the configuration of the laser light source portion and the four-way radiating unit. The remaining configuration of the second embodiment is the same as that of the corresponding portions of the first embodiment.

Figure 12:
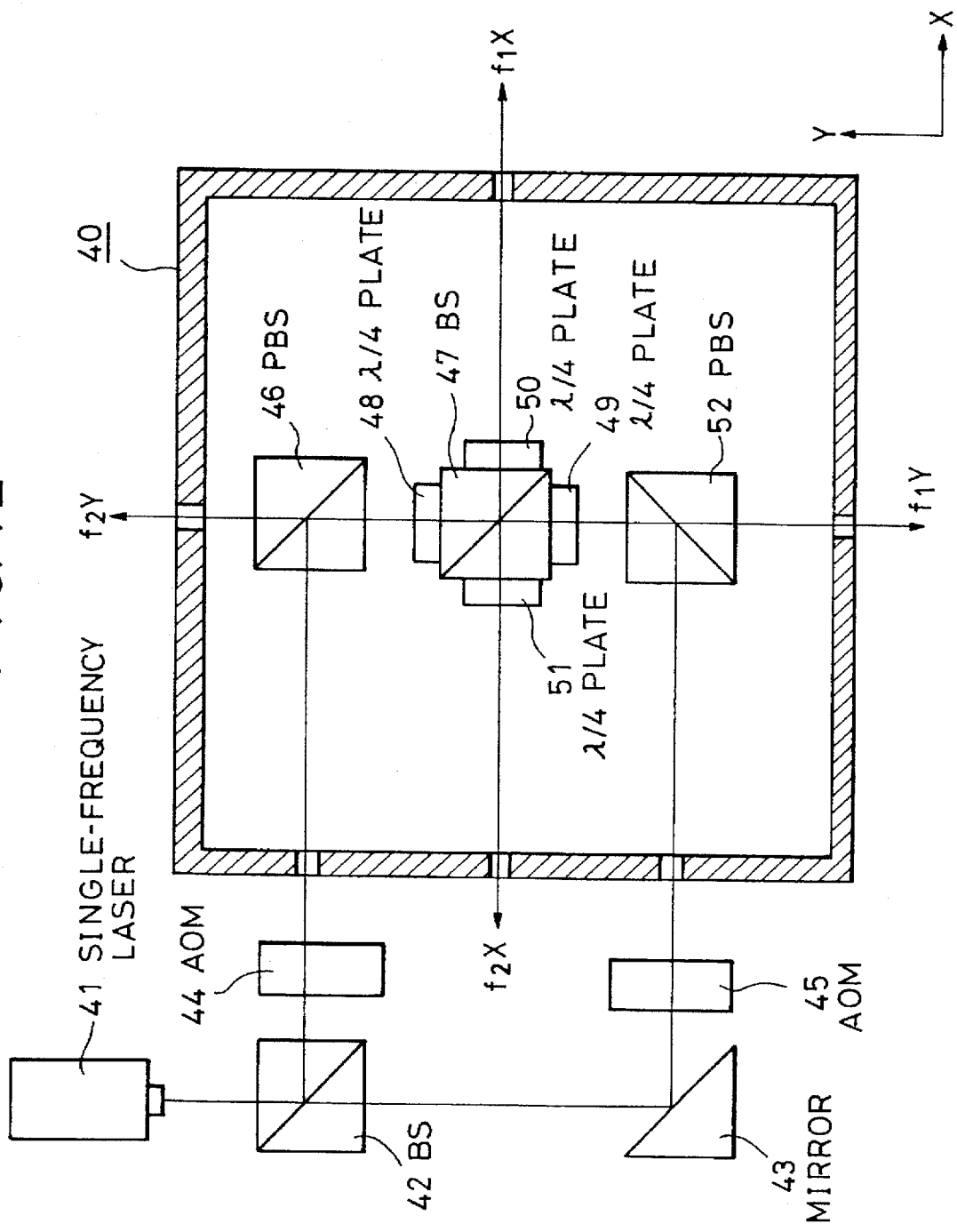
FIG. 12 is a schematic diagram for illustrating the configuration of a primary part of a four-way radiating unit of FIG. 11.

FIG. 12 is a schematic diagram for illustrating the configuration of the primary part of the second embodiment from the light source means to the four-way radiating unit. In this embodiment, the light source means is a single-frequency laser 41 which has a frequency $f_0$ and emits an S-polarized light (namely, the direction, in which the electric-field vector of the light oscillates, is vertical to the plane of this figure). In this figure, reference numeral 40 denotes the entire four-way radiating unit of the second embodiment; 42 and 47 BSs; 43 a mirror; 46 and 52 PBSs; and 44 and 45 acousto-optic modulators (AOMs). AOM 44 performs frequency modulation on laser light having a frequency $f_0$ so as to shift the frequency thereof by $\Delta f_1$ and convert the laser light into light having a frequency $f_1$. Further, AOM 45 performs frequency modulation on the laser light having the frequency $f_0$ so as to shift the frequency thereof by $\Delta f_2$ and convert the laser light into light having a frequency $f_2$. Reference numerals 48, 49, 50 and 51 denote quarter-wave plates (λ/4 plates). The single-frequency laser 41, the BS 42, the mirror 43, the AOMs 44 and 45 and the four-way radiating unit 40 are elements of the four-way radiating means.

Hereinafter, an operation of this embodiment will be described. A light ray having an S-polarized-light luminous flux, which is emitted from the single-frequency laser 41 and has the frequency $f_0$, is split by the BS 42 into two light rays. A light ray reflected by this BS is converted by the AOM 44 into light having the frequency $f_1$ which is then incident on the four-way radiating unit 40. Subsequently, this incident light is reflected by the PBS 46. Further, this reflected light is incident on the BS 47 which then splits this incident light into two light rays. Thereafter, the transmitted light ray passes through the quarter-wave plates 48 and 49 and on the other hand, the reflected light ray passes through the quarter-wave plates 48 and 50. Finally, these light rays become P-polarized light rays and are emitted from the unit 40 as light $f_1Y$ and $f_1X$, respectively.

Meanwhile, the light ray transmitted by the BS 42 is next deflected by the mirror 43. Further, this deflected light is changed by the AOM 45 into light having the frequency $f_2$ which is then incident on the four-way radiating unit 40. This incident light is reflected by the PBS 52. Moreover, this reflected light is incident on the BS 47 which splits this light into two light rays. Thereafter, the light transmitted by the BS 47 passes through the quarter-wave plates 49 and 48 and on the other hand, the reflected light ray passes through the quarter-wave plates 49 and 51. Finally, these light rays become P-polarized light rays and are emitted from the unit 40 as light $f_2Y$ and $f_2X$, respectively.

Incidentally, in this embodiment, the four-way radiating unit 40 emits the light rays respectively corresponding to the four luminous fluxes in four directions into a plane parallel to the surface of the substrate.

Further, the remaining units of this embodiment may be the same as the corresponding units of the embodiment shown in FIG. 1. Additionally, the frequencies of the incident luminous fluxes in the X-direction have an inverse relation between the frequencies of the incident luminous fluxes in the same direction in the case of FIG. 1. Thus, in the case of the second embodiment, a positional deviation in the X-direction has an opposite sign as that of the corresponding positional deviation in the X-direction in the case of the apparatus of FIG. 1.

Figure 13:
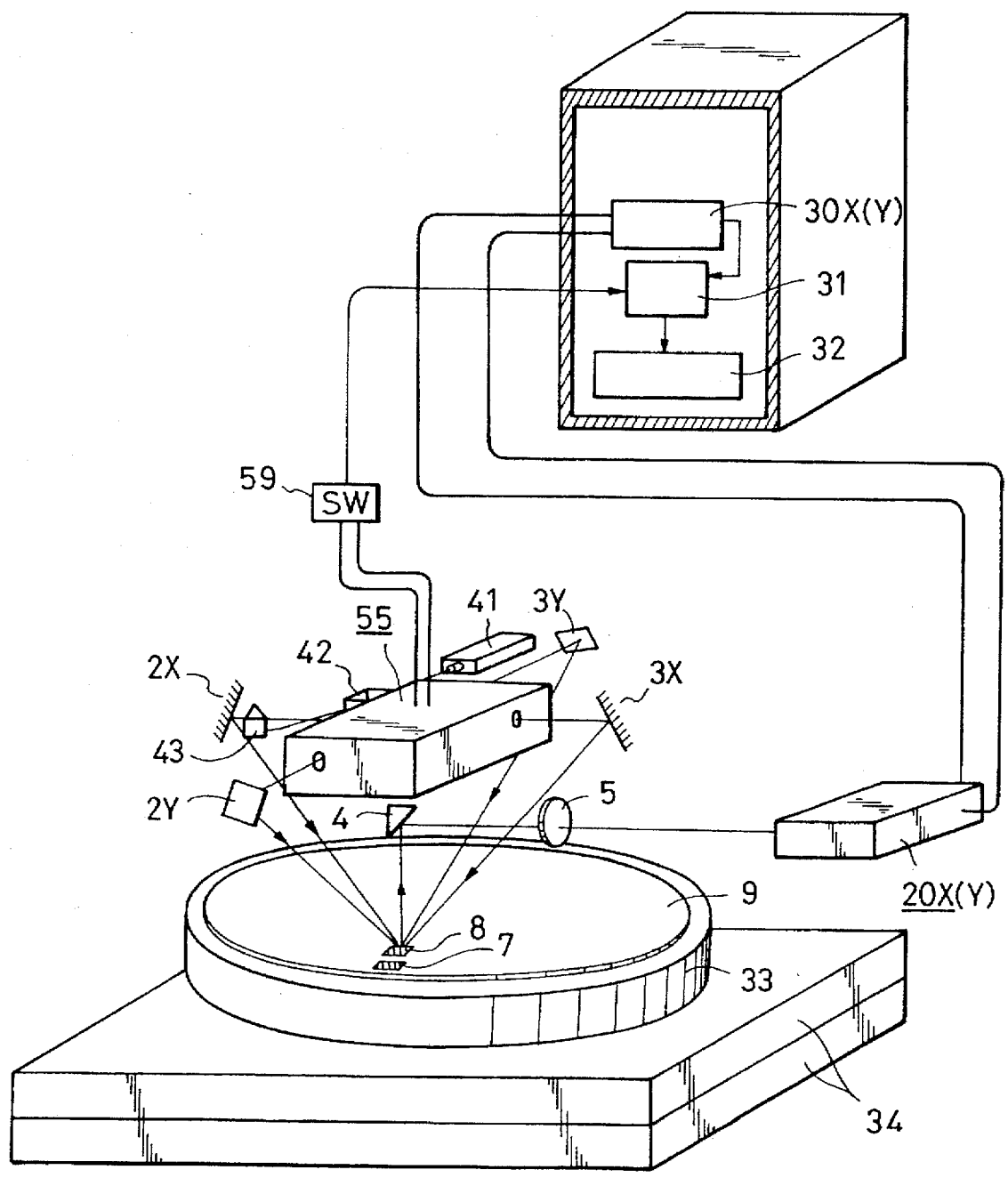
FIG. 13 is a schematic diagram for illustrating the configuration of a primary part of still another apparatus for detecting a positional deviation by utilizing optical heterodyne interference according to a third embodiment of the present invention.

FIG. 13 is a schematic diagram for illustrating the configuration of the primary part of still another apparatus for detecting a positional deviation by utilizing optical heterodyne interference according to the present invention, namely, the third embodiment of the present invention. The third embodiment is different in structure from the second embodiment only in that the four-way radiating unit has a different configuration and that the third embodiment has no means respectively corresponding to the PBS 6, the beat signal forming unit 20Y and the phase difference meter 30Y. The remaining configuration of the third embodiment is the same as that of the corresponding portions of the second embodiment.

Figure 14:
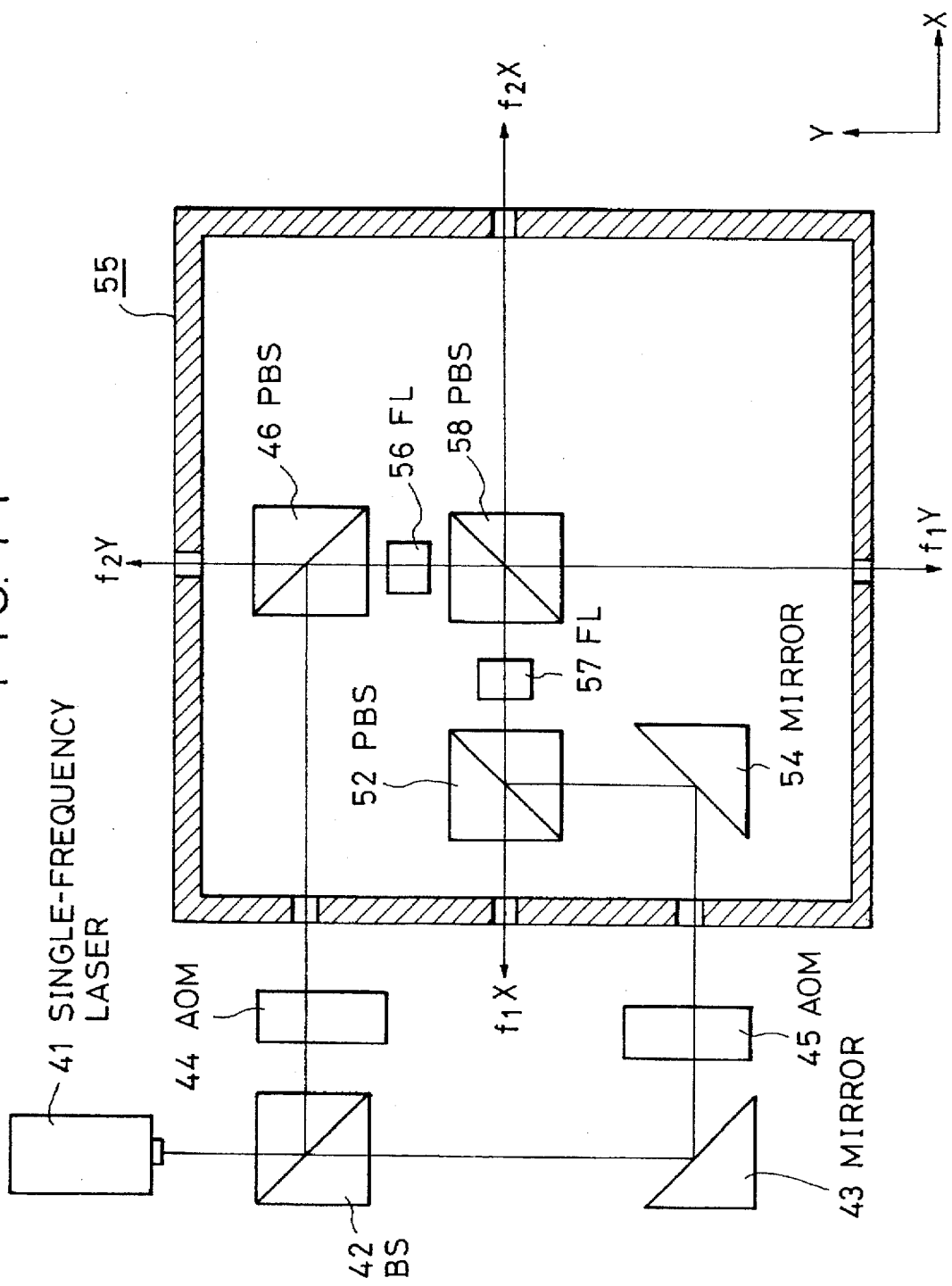
FIG. 14 is a schematic diagram for illustrating the configuration of a primary part of a four-way radiating unit of FIG. 13.

FIG. 14 is a schematic diagram for illustrating the configuration of the primary part of the third embodiment from the light source means to the four-way radiating unit of FIG. 13. In this embodiment, a part from the single-frequency laser 41 to the portion for converting the light emitted therefrom into light rays having the frequencies $f_1$ and $f_2$ is the same as the corresponding part of the second embodiment of FIG. 12. In FIG. 14, reference numeral 55 designates the entire four-way radiating unit of the third embodiment; 55 a mirror; and 46, 52 and 58 PBSs.

Reference numerals 56 and 57 denote Faraday rotators (hereafter abbreviated as FLs). FLs 56 and 57 are operative to rotate the plane of polarization by utilizing Faraday effects. An angle (ε) of rotation of the plane of polarization depends upon Verdet's constant (V), the magnetic field strength (H) and the length (L) of a Faraday medium and is expressed as follows.

$$\epsilon = V \cdot H \cdot L \qquad (27)$$

Here, note that the states of the FLs 56 and 57 can be changed by switching a switching means 59 between an OFF-state corresponding to the magnetic field strength H=H1=0 and an ON-state corresponding to the magnetic field strength H=H1=π/(2V·L). Namely, in the case of the OFF-state, the plane of polarization of incident light does not change when transmitted by the FL. Further, in the case of the ON-state, the plane of polarization of incident light is rotated by 90 degrees when transmitted by the FL.

The switching means 59 is operative to turn on and off the FLs 56 and 57 alternately and to send a signal to the computing unit in synchronization with this and to output information indicating that the apparatus performs a measurement in a first direction or measurement in a second direction.

Incidentally, the mirror 4, the lens 5, the beat signal forming unit 20X and so on are elements comprising the detecting means.

An operation of this embodiment will now be described. Light converted as having the frequency $f_1$ is reflected by the PBS 46 and the reflected light is then incident on the FL 56. On the other hand, light converted as having the frequency $f_2$ is deflected by the mirror 54 and the deflected light is then reflected by the PBS 52. Subsequently, the reflected light is incident on the FL 57.

In the case of detecting a deviation in the X-direction, the FL 56 is turned off and the FL 57 is turned on by the switching means 59. At that time, light $f_1X$ and light $f_2X$, whose electric-field vectors oscillate in a direction in the XY-plane, are emitted from the four-way radiating unit 55. Moreover, the pair of the diffraction gratings 7 and 8 are irradiated with the light $f_1X$ and the light $f_2X$. Then, the first diffracted light from the pair of the diffraction gratings 7 and 8 is guided to the detecting means wherein the guided light is split by the beat signal forming means 20X into diffracted light rays respectively corresponding to these two diffraction gratings. Subsequently, the diffracted light rays are received by the sensors. Thus, two beat signals for measuring a positional deviation in the X-direction are obtained. Further, the phase difference between the two beat signals is detected by the phase difference meter 30X. Finally, a positional deviation in the X-direction is obtained by the computing unit 31.

Thereafter, when the FL 56 is turned on and the FL 57 is turned off by the switching means 59, light $f_1Y$ and light $f_2Y$, whose electric-field vectors oscillate in a direction in the XY-plane, are emitted. Similarly, two beat signals for measuring a positional deviation in the Y-direction are obtained. Moreover, the phase difference between the two beat signals is detected by the phase difference meter 30X. Finally, a positional deviation in the Y-direction is obtained by the computing unit 31.

In this way, in this embodiment, the switching between the X-direction irradiating light and the Y-direction irradiating light can be achieved by performing an electrical switching operation by use of the switching means 59. Thereby, the structure of the detecting means can be simplified. 1308 Moreover, in this embodiment, the throughput can be improved. Furthermore, the quantity of incident light can be effectively utilized.

Incidentally, in this embodiment, the four-way radiating unit 55 emits the light rays respectively corresponding to four luminous fluxes in four directions into a plane parallel to the surface of the substrate.

Further, the means for rotating the direction of polarization is not limited to a Faraday rotator. For example, a device utilizing electro-optical effects may be used as the means for rotating the direction of polarization. Moreover, when the throughput may be lowered, the direction of polarization can be mechanically changed by using a wave plate.

Furthermore, radiating beams respectively corresponding to the X- and Y-directions may be switched with each other by providing a shutter at an exit of the four-way radiating unit of FIG. 2 and opening and closing the shutter through the switching means.

Figure 15:
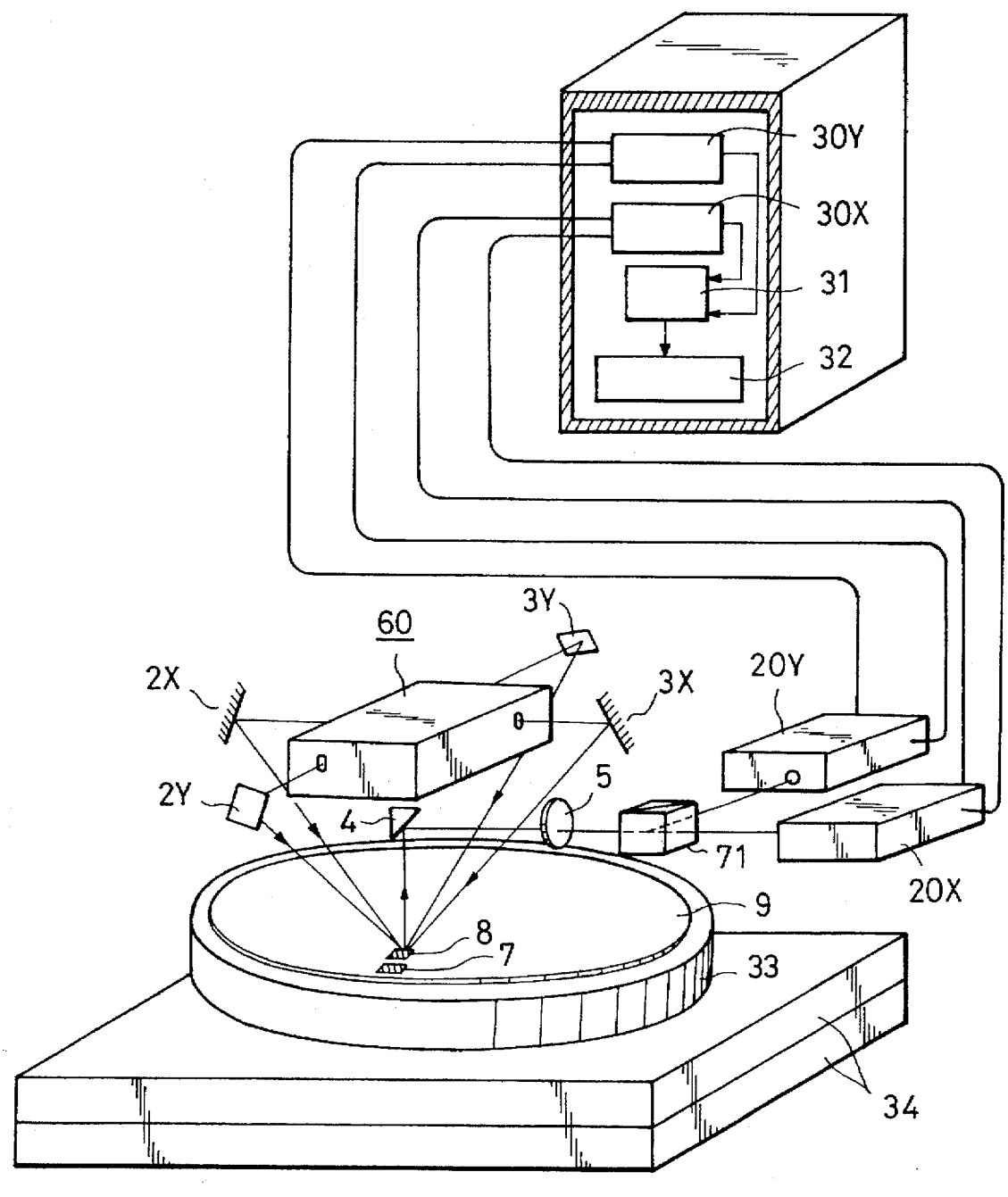
FIG. 15 is a schematic diagram for illustrating the configuration of a primary part of yet another apparatus for detecting a positional deviation by utilizing optical heterodyne interference according to a fourth embodiment of the present invention.
Figure 16:
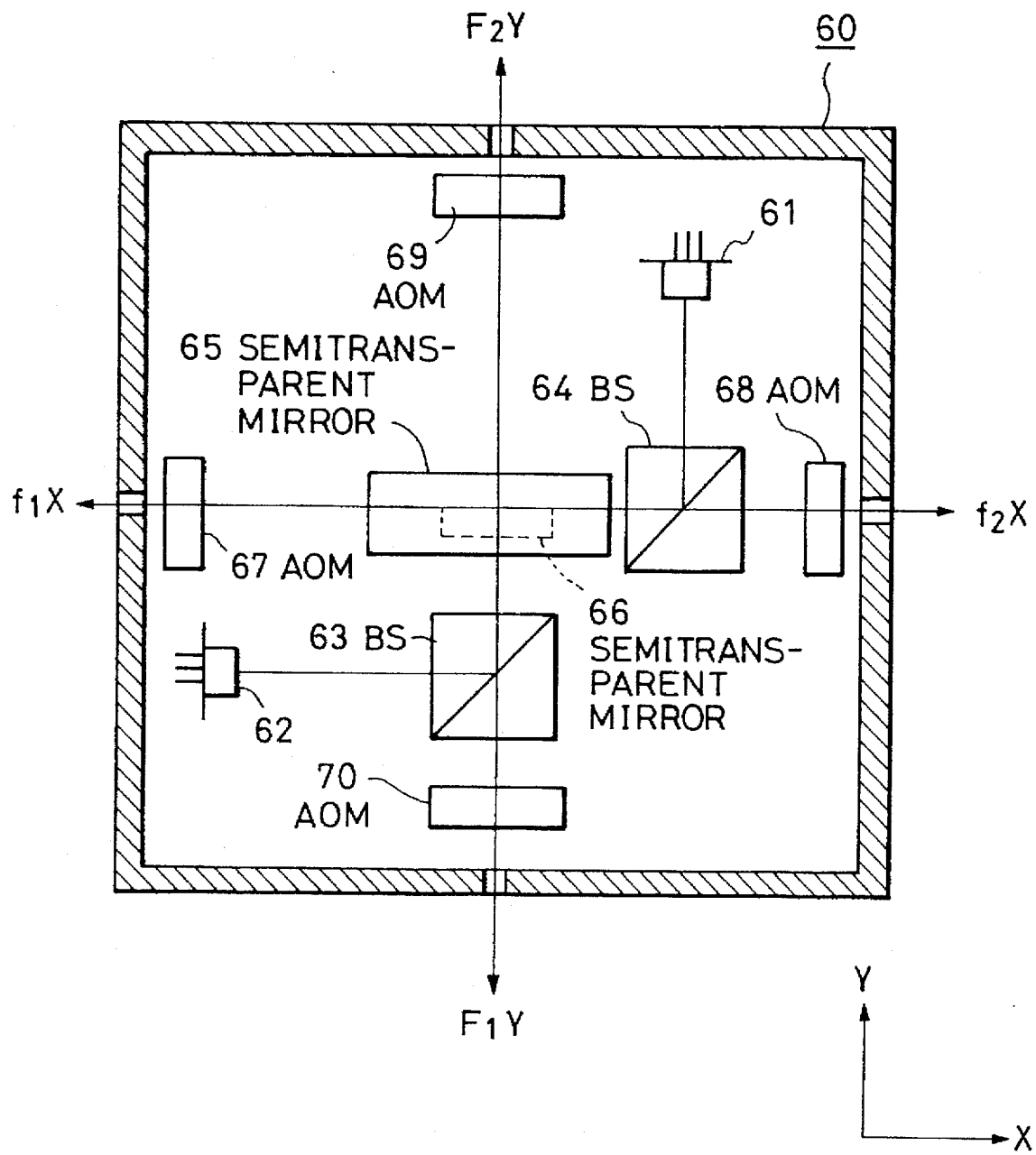
FIG. 16 is a schematic diagram for illustrating the configuration of a primary part of a four-way radiating unit of FIG. 15.

FIG. 15 is a schematic diagram for illustrating the configuration of the primary part of yet another apparatus for detecting a positional deviation by utilizing optical heterodyne interference according to the present invention, namely, a fourth embodiment of the present invention. FIG. 16 is a schematic diagram for illustrating the configuration of the primary part of a four-way radiating unit employed in this fourth embodiment. This embodiment is different in structure from the embodiment of FIG. 1 only in that the part from the light source to the four-way radiating unit is different from the corresponding part of the first embodiment and that a dichroic mirror 71 is used instead of the PBS 6. The remaining configuration of this embodiment is the same as that of the corresponding portions of the first embodiment. Incidentally, the dichroic mirror 71 is an element of the luminous flux separating means.

Figure 17:
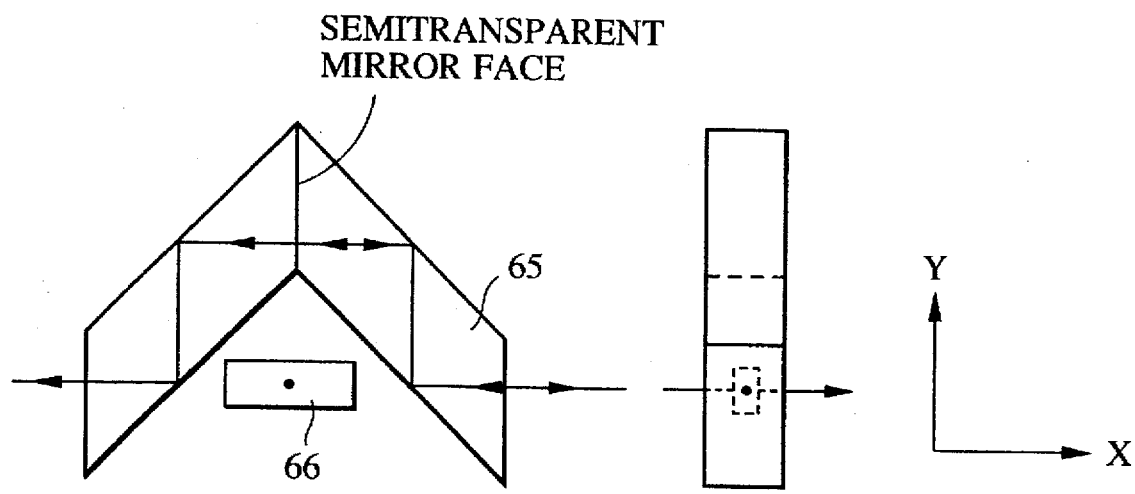
FIG. 17 is a diagram for illustrating the configuration of a semitransparent mirror prism and a semitransparent or half-silvered mirror of FIG. 16.

In these figures, reference numeral 60 denotes the entire four-way radiating unit of the fourth embodiment; 61 a first laser light source (namely, a single-frequency laser having a frequency $f_0$); and 62 a second laser light source (namely, a single-frequency laser having a frequency $F_0$). Thus, two laser light sources are used as the light source means. Reference numerals 63 and 64 designate BSs; 66 a semitransparent mirror; 65 a semitransparent mirror prism as illustrated in FIG. 17; and 67, 68 and 70 AOMs. The four-way radiating unit is an element of the four-way radiating means.

Incidentally, the mirror 4, the lens 5, the dichroic mirror 71, the beat signal forming units 20X and 20Y and so forth are elements of the detecting means. Further, the beat signal forming unit 20X is an element of the first detecting means, and the beat signal forming unit 20Y is an element of the second detecting means.

An operation of this embodiment will now be described. Light of the frequency $f_0$, which is emitted from the single-frequency laser 61, is reflected by the BS 64. The reflected light is then incident on the semitransparent mirror prism 65. Further, the incident light is split at the semitransparent mirror face of the prism into a transmitted light ray and a reflected light ray which are subsequently incident on the AOM 67 and the AOM 68, respectively. These incident light rays undergo the frequency shifts of $\Delta f_1$ and $\Delta f_2$, respectively. As a result, light $f_1X$ and light $f_2X$ are emitted from the unit 55.

On the other hand, light having the frequency $F_0$, which is emitted from the single-frequency laser 62, is reflected by the BS 63. The reflected light is then incident on the semitransparent mirror 66. A side surface of the semitransparent mirror 66 is a half-silvered face. Further, the other side surface of the mirror 66 is coated with a nonreflective coating. This incident light is split on this half-silvered face into transmitted and reflected light rays which are subsequently incident on the AOMs 69 and 70. These incident light rays undergo the frequency shifts of $\Delta F_1$ and $\Delta F_2$, respectively. As a result, light $F_1Y$ and light $F_2Y$ are emitted from the unit 55.

Incidentally, in this embodiment, the four-way radiating unit 60 emits the light rays respectively corresponding to four luminous fluxes in four directions into a plane parallel to the surface of the substrate.

Figure 18:
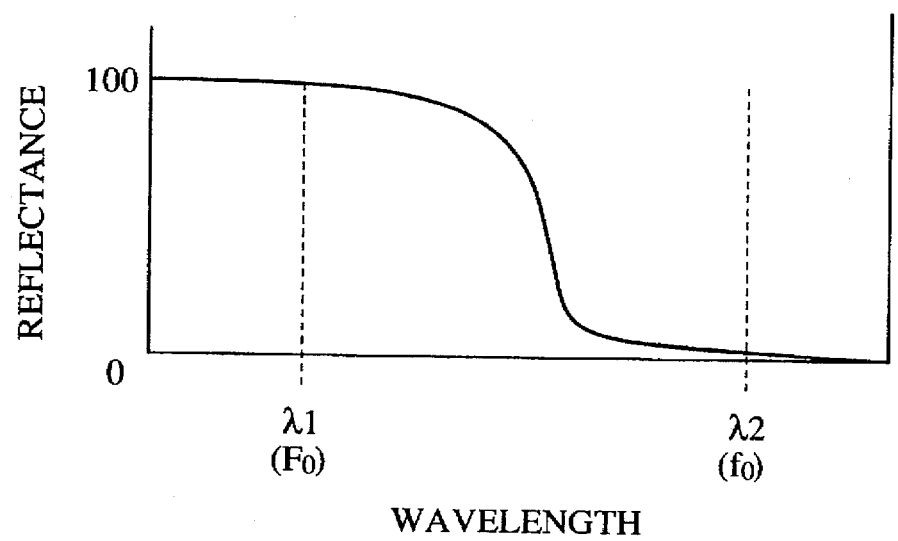
FIG. 18 is a graph for illustrating wavelength characteristics of a dichroic mirror of FIG. 15.

The separation of beams respectively used for measuring deviations in the X- and Y-directions is performed by the dichroic mirror 71 which is constituted by a dielectric multi-layer film. The wavelength characteristics of the dichroic mirror are shown in FIG. 18. Light having the frequency $f_0$ (the wavelength is $\lambda 2$) and light rays having the frequencies $f_1$ and $f_2$, which are close to the frequency $f_0$, namely, beams for detecting a positional deviation in the X-direction are transmitted by the dichroic mirror 71. Further, light having the frequency $F_0$ (the wavelength is $\lambda 1$) and light rays having the frequencies $F_1$ and $F_2$, which are close to the frequency $F_0$, namely, beams for detecting a positional deviation in the Y-direction are reflected by the dichroic mirror 71. The transmitted light and the reflected light are incident on the beat signal forming units 20X and 20Y, respectively. Amounts of deviations in the X- and Y-directions are obtained from the beat signals by performing the method described in the first embodiment.

This dichroic mirror 71 may be replaced with a plurality of dichroic mirrors in order to facilitate the design of the film.

Figure 19:
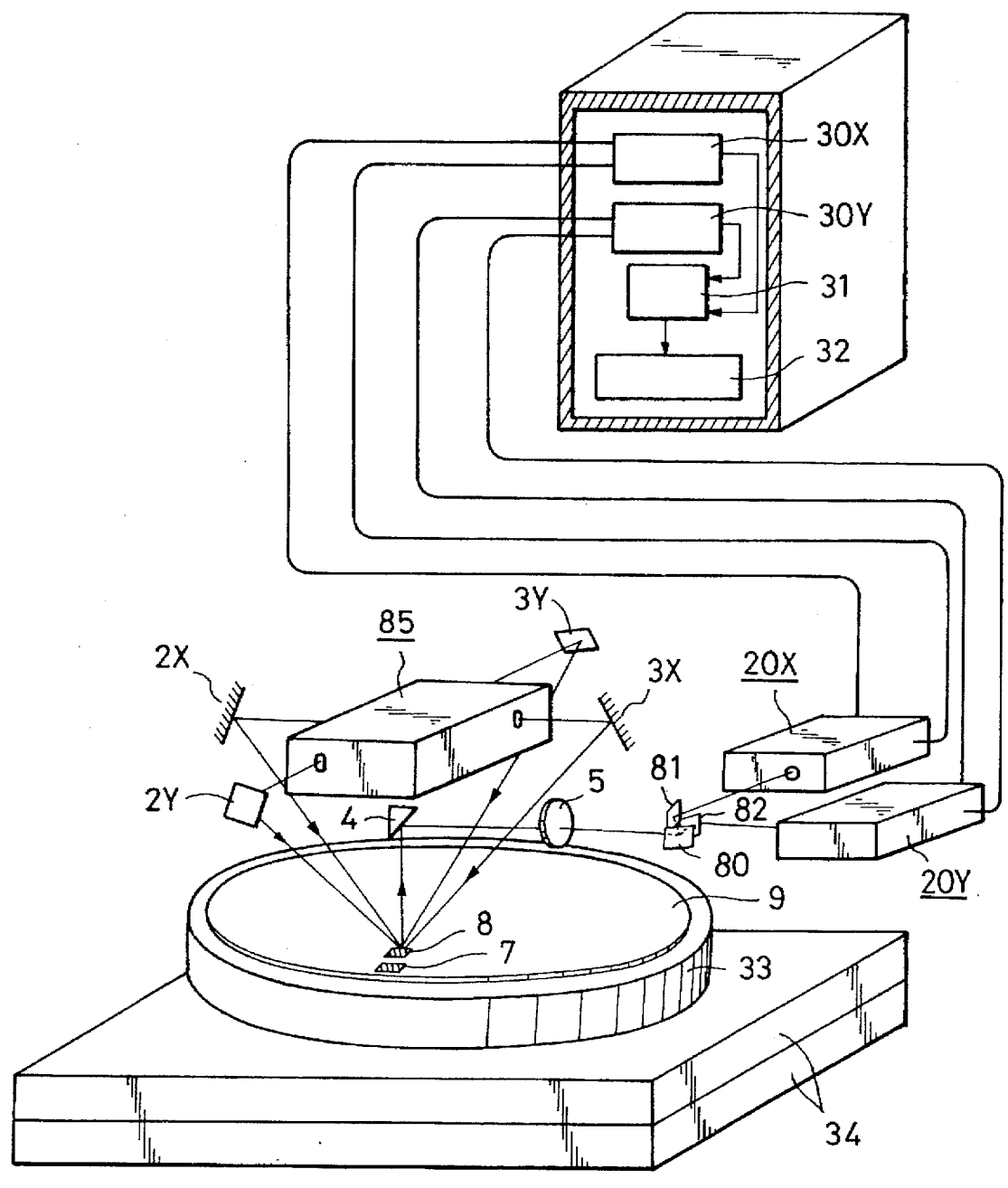
FIG. 19 is a schematic diagram for illustrating the configuration of a primary part of a further apparatus for detecting a positional deviation by utilizing optical heterodyne interference according to a fifth embodiment of the present invention.
Figure 20:
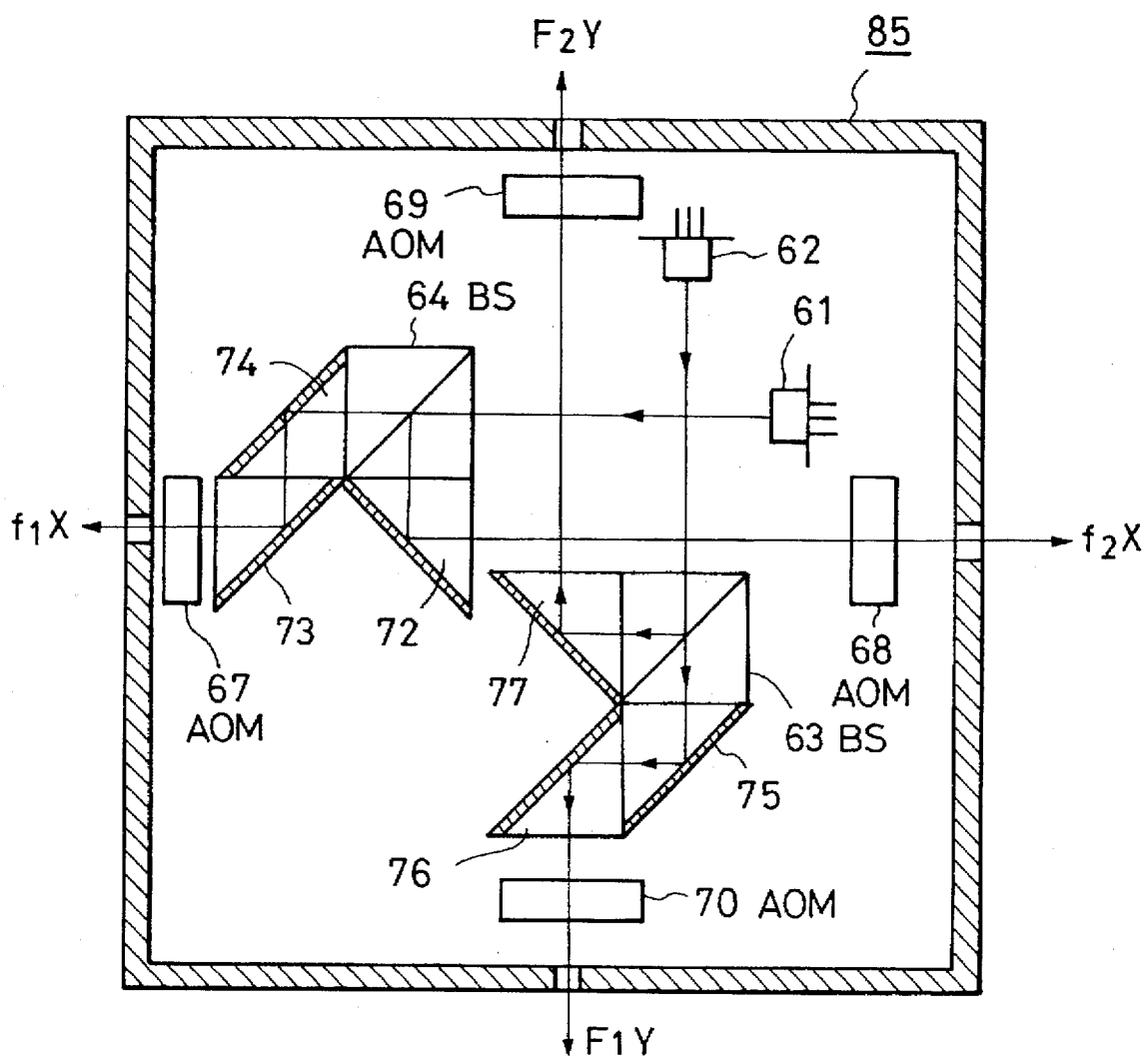
FIG. 20 is a schematic diagram for illustrating the configuration of a primary part of a four-way radiating unit of FIG. 19.

FIG. 19 is a schematic diagram for illustrating the configuration of the primary part of a further apparatus for detecting a positional deviation by utilizing optical heterodyne interference according to the present invention, namely, a fifth embodiment of the present invention. FIG. 20 is a schematic diagram for illustrating the configuration of the primary part of the four-way radiating unit of this embodiment. The fifth embodiment is different in structure from the fourth embodiment of FIG. 15 only in that the configuration of the four-way radiating unit of the fifth embodiment is different from the corresponding unit of the fourth embodiment and that the separation of the beams respectively used for measuring a deviation in the X- and Y-directions is performed by a diffraction grating 80 without using the dichroic mirror 71. The remaining configuration of this embodiment is the same as that of the corresponding portions of the fourth embodiment.

In FIGS. 19 and 20, reference numeral 85 designates the entire four-way radiating unit of the fifth embodiment; 63 and 64 BSs; 72, 73, 74, 75, 76 and 77 prism mirrors; 67, 68, 69 and 70 AOMs; and 80 the diffraction grating for separating the diffracted light rays of frequencies $f_1$ and $f_2$ and the diffracted light rays of frequencies $F_1$ and $F_2$ by performing the diffraction thereof. The diffraction grating 80 is an element of the luminous flux separating means. Further, reference numerals 81 and 82 denote mirrors.

Incidentally, the mirror 4, the lens 5, the diffraction grating 80, the beat signal forming units 20X and 20Y and so forth are elements of the detecting means. Further, the beat signal forming units 20X and 20Y are an element of the first detecting means and an element of the second detecting means, respectively.

Operation of this embodiment will now be described. Light of the frequency $f_0$, which is emitted from the single-frequency laser 61, is split by the BS 64 into two light rays. These light rays are then deflected by the prism mirrors, respectively. Subsequently, the deflected light rays are incident on the AOM 67 and the AOM 68. These incident light rays undergo the frequency shifts of $\Delta f_1$ and $\Delta f_2$, respectively. As a consequence, light $f_1X$ and light $f_2X$ are emitted from the unit 85. On the other hand, light having the frequency $F_0$, which is emitted from the single-frequency laser 62, is similarly split by the BS 63 into two light rays. These light rays are then deflected by the prism mirrors, respectively. Subsequently, the deflected light rays are incident on the AOM 69 and the AOM 70, respectively. These incident light rays undergo the frequency shifts of $\Delta F_1$ and $\Delta F_2$, respectively. As a consequence, light $F_1Y$ and light $F_2Y$ are emitted from the unit 85.

Incidentally, in this embodiment, the four-way radiating unit 85 emits the light rays respectively corresponding to four luminous fluxes in four directions into a plane parallel to the surface of the substrate.

Figure 21:
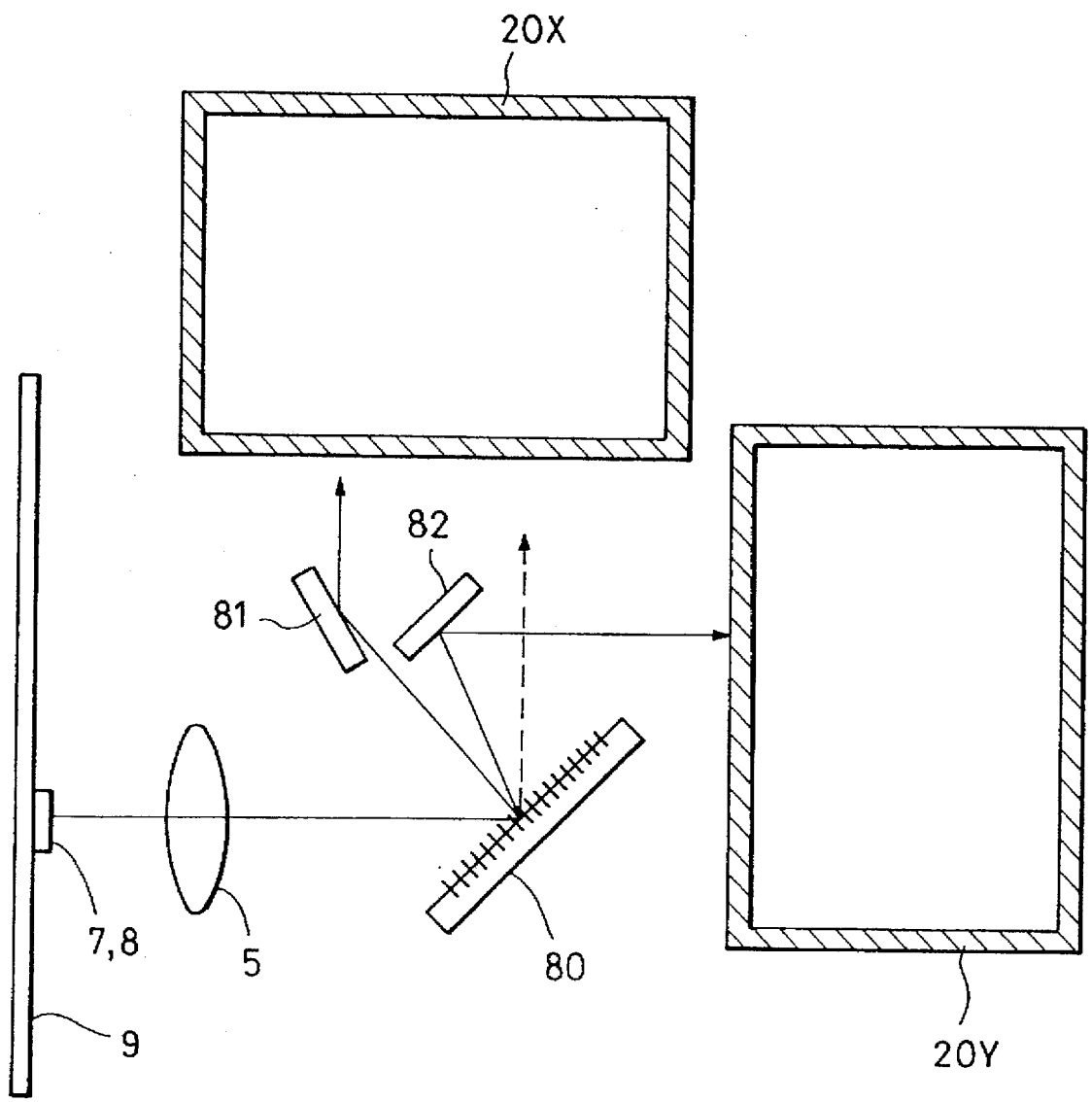
FIG. 21 is a diagram for illustrating the separation of beams of FIG. 19 respectively used for measuring deviations in the X- and Y-directions.
Figure 22:
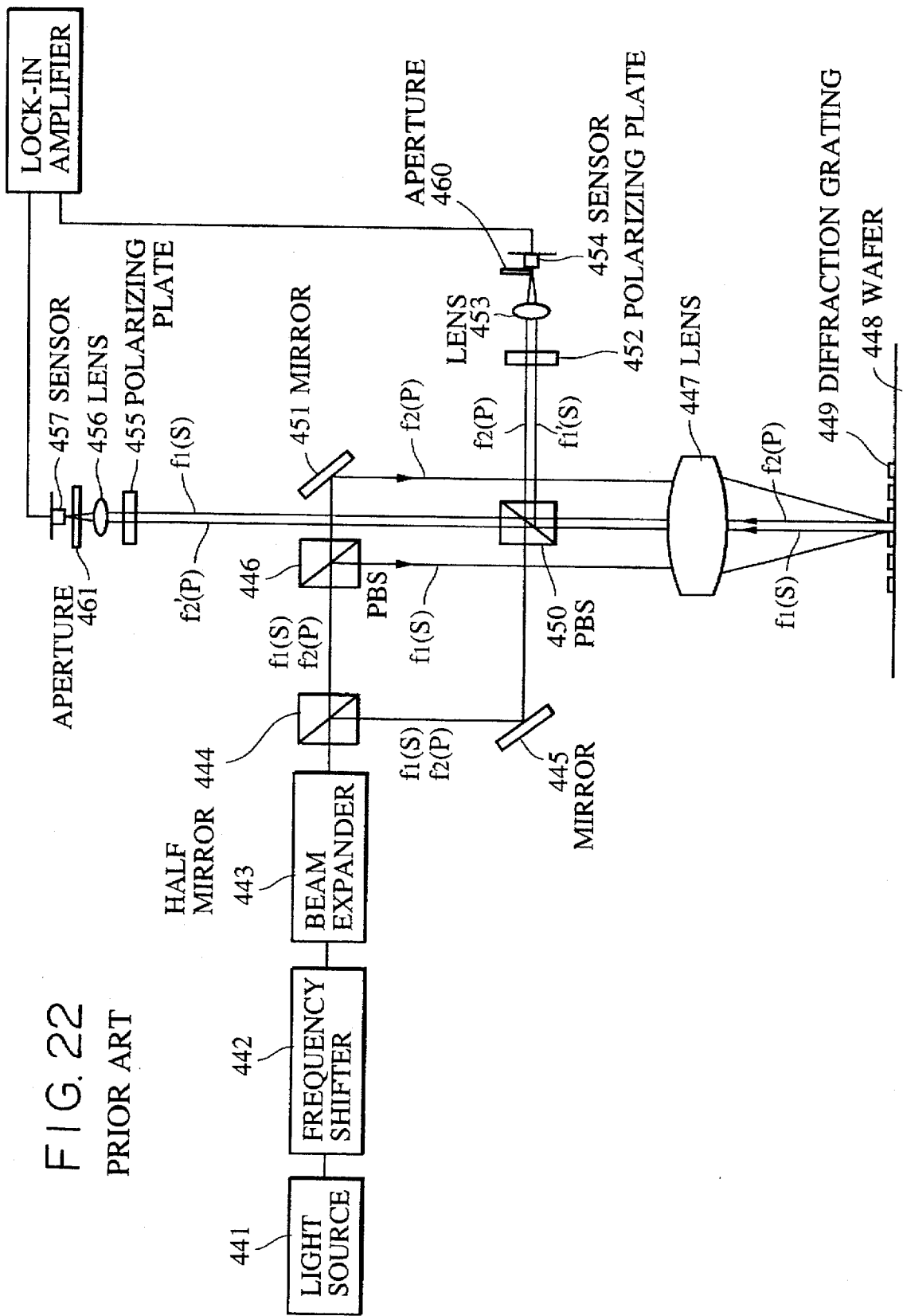
FIG. 22 is a diagram for illustrating the configuration of a conventional apparatus for detecting a positional deviation.
Figure 23:
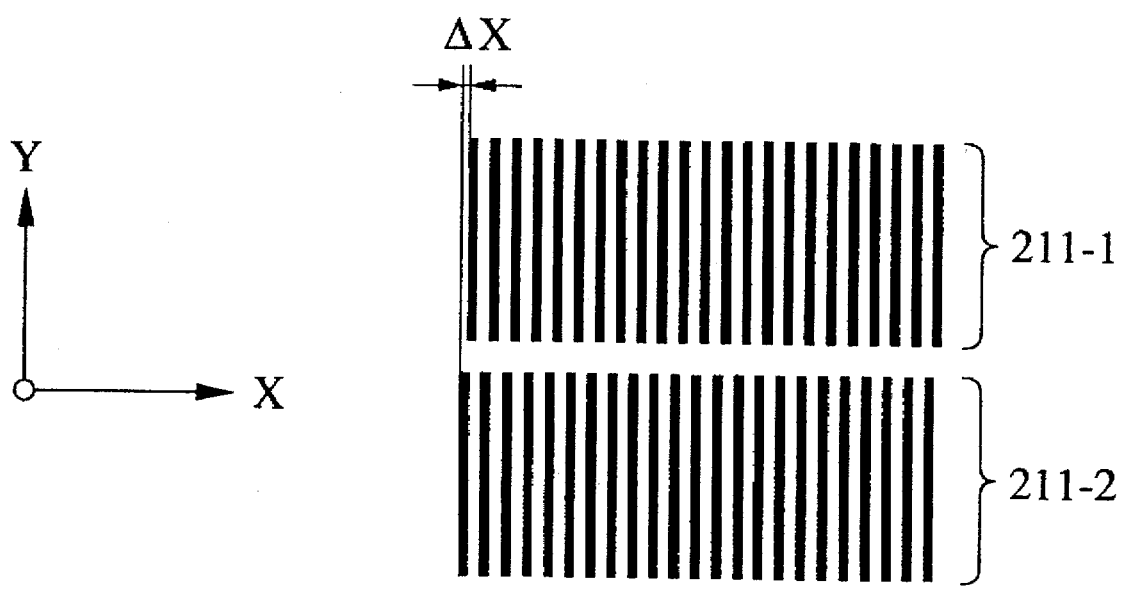
FIG. 23 is a diagram for illustrating linear diffraction gratings used in the conventional apparatus.

The separation of beams respectively used for measuring deviations in the X- and Y-directions is performed by the diffraction grating 80 as illustrated in FIG. 21. Further, beams having the frequencies $f_1$ and $f_2$, which are used for measuring a deviation in the X-direction, are different in diffraction angle at the diffraction grating 80 from beams having the frequencies $F_1$ and $F_2$, which are used for measuring a deviation in the Y-direction. Thus, the former beams for measuring a deviation in the X-direction can be easily separated from the latter for measuring a deviation in the Y-direction. The former beam and the latter beam are then incident on the beat signal forming units 20X and 20Y, respectively. Subsequently, amounts of deviations in the X- and Y-directions are obtained from the beat signals by performing the method described in the first embodiment.

Incidentally, in the foregoing description, apparatuses for detecting a positional deviation between two diffraction gratings formed on the same substrate have been described. However, as another application of the present invention, an apparatus for detecting positional deviations in the X- and Y-directions of a substrate on which checkered diffraction gratings are formed, alternatively, alignment equipment for performing the alignment of a mask (or a reticle) and a semiconductor wafer by forming checkered diffraction gratings on the mask (or reticle) and the semiconductor wafer, respectively, and detecting the positional deviations of the diffraction gratings can be realized. This apparatus for detecting positional deviations in the X- and Y-directions of a substrate on which checkered diffraction gratings are formed, and this alignment equipment for performing the alignment of the mask (or reticle) and the semiconductor wafer would be easily created by those skilled in the art by using known techniques.

Except as otherwise disclosed herein, the various components shown in outline or in block form in the figures are individually well known and their internal construction and operation are not critical either to the making or using of this invention or to a description of the best mode of the invention.

Although the preferred embodiments of the present invention have been described above, it should be understood that the present invention is not limited thereto and that other modifications will be apparent to those skilled in the art without departing from the spirit of the invention.

The scope of the present invention, therefore, is to be determined solely by the appended claims.

What is claimed is:

1. A positional deviation detecting apparatus for detecting a positional deviation in a predetermined direction of two diffraction gratings of each of first and second pairs of diffraction gratings formed on a surface of a substrate, by utilizing optical heterodyne interference, said positional deviation detecting apparatus comprising:

first light emitting means for emitting a pair of coherent light beams having different frequencies close to a first frequency;

second light emitting means for emitting a pair of coherent light beams having different frequencies close to a second frequency, different from the first frequency;

four-way radiating means for radiating the two pairs of light beams in four directions and for causing a selected pair of the coherent light beams to be incident on a corresponding one of the first and second pairs of the diffraction gratings such that corresponding beam spots on the corresponding one of the first and second pairs of the diffraction gratings overlap with each other;

splitting means for splitting diffracted light beams from the first and second pairs of the diffraction gratings, according to frequencies of the diffracted light beams, so as to separate (i) a first diffracted light beam of a predetermined order, which is diffracted from the first pair of diffraction gratings in a diffraction direction perpendicular to the surface of the substrate, and (ii) a second diffracted light beam of a predetermined order, which is diffracted from the second pair of diffraction gratings in the same direction as that of the first diffracted light beam;

beat signal detecting means for detecting beat signals respectively corresponding to the split light beams; and deviation detecting means for receiving the beat signals detected by said beat signal detecting means and for detecting a positional deviation in a predetermined measuring direction of two diffraction gratings of each of the first and second pairs, from the beat signals respectively corresponding to the two diffraction gratings of a corresponding one of the first and second pairs.

2. The positional deviation detecting apparatus according to claim 1, wherein said four-way radiating means comprises means for radiating the two pairs of coherent light beams in four directions in a plane parallel to the surface of the substrate.

3. The positional deviation detection apparatus according to claim 1, wherein each of said first and second light emitting means comprises a single-frequency laser and an acousto-optical modulator for forming the respective pair of coherent light beams.

4. The positional deviation detecting apparatus according to claim 1, wherein said splitting means comprises one of a dichroic mirror and a diffraction grating, for splitting the light beams respectively diffracted from the diffraction gratings of the first and second pairs.

5. A positional deviation detecting apparatus for detecting a positional deviation in a first direction, which is in a plane of a substrate, of two diffraction gratings of a first pair of diffraction gratings formed on the surface of the substrate and detecting a positional deviation in a second direction perpendicular to the first direction, which is in the plane of the substrate, of two diffraction gratings of a second pair of diffraction gratings formed on the surface of the substrate, by utilizing optical heterodyne interference, said positional deviation detecting apparatus comprising:

first light emitting means for emitting a first pair of coherent light beams having different frequencies close to a first frequency;

second light emitting means for emitting a second pair of coherent light beams having different frequencies close to a second frequency, different from the first frequency;

irradiating means for causing two light beams respectively corresponding to the first pair of light beams to be incident upon the first pair of diffraction gratings from opposite directions, in a plane containing the first direction, with respect to a normal to the surface of the substrate, and for causing two light beams respectively corresponding to the second pair of light beams to be incident upon the second pair of diffraction gratings from opposite directions, in a plane containing the second direction, with respect to the normal to the surface of the substrate, thereby generating beam spots on the first and second pairs of diffraction gratings;

splitting means for splitting diffracted light beams from the first and second pairs of the diffraction gratings, according to frequencies of the diffracted light beams, so as to separate (i) a first diffracted light beam of a predetermined order, which is diffracted from the first pair of diffraction gratings in a diffraction direction perpendicular to the surface of the substrate, and (ii) a second diffracted light beam of a predetermined order, which is diffracted from the second pair of diffraction gratings in the same diffraction direction as that of the first diffracted light beam;

beat signal detecting means for detecting beat signals respectively corresponding to the split light beams;

first deviation detecting means for receiving first and second beat signals detected by said beat signal detecting means from the light beams diffracted from the first pair of diffraction gratings and for detecting a phase difference between the first and second beat signals to thereby detect a positional deviation of the diffraction gratings of the first pair; and second deviation detecting means for receiving third and fourth beat signals detected by said beat signal detecting means from the light beams diffracted from the second pair of diffraction gratings and for detecting a phase difference between the third and fourth beat signals to thereby detect a positional deviation of the diffraction gratings of the second pair.

6. The positional deviation detection apparatus according to claim 5, wherein each of said first and second light emitting means comprises a single-frequency laser and an acousto-optical modulator for forming the respective pair of coherent light beams.

7. The positional deviation detecting apparatus according to claim 5, wherein said splitting means comprises one of a dichroic mirror and a diffraction grating for splitting the light beams respectively diffracted from the diffraction gratings of the first and second pairs.

* * * * *

UNITED STATES PATENT AND TRADEMARK OFFICE
CERTIFICATE OF CORRECTION

PATENT NO. : 5,682,239
DATED : October 28, 1997
INVENTOR(S) : TAKAHIRO MATSUMOTO, ET AL.

It is certified that error appears in the above-identified patent and that said Letters Patent is hereby corrected as shown below:

COLUMN 3

Line 51, "frequencies" should read --frequencies,--.

COLUMN 5

Line 37, "Dear" should read --beat--.

COLUMN 11

Line 3, "Such" should read --such--.

COLUMN 17

Line 17, "H=H1=π/(2V·L)." should read --H=H2=π/(2V·L).--.

COLUMN 18

Line 3, "1308" should be deleted.

Signed and Sealed this

Twenty-eighth Day of April, 1998

*Attest:*

BRUCE LEHMAN

*Attesting Officer*     *Commissioner of Patents and Trademarks*